(12) United States Patent
Ngo

(10) Patent No.: US 12,381,570 B2
(45) Date of Patent: Aug. 5, 2025

(54) SEMICONDUCTOR INTEGRATED CIRCUIT AND RECEIVER DEVICE

(71) Applicant: Kioxia Corporation, Tokyo (JP)

(72) Inventor: Huy Cu Ngo, Isehara Kanagawa (JP)

(73) Assignee: Kioxia Corporation, Tokyo (JP)

( * ) Notice: Subject to any disclaimer, the term of this patent is extended or adjusted under 35 U.S.C. 154(b) by 247 days.

(21) Appl. No.: 18/209,380

(22) Filed: Jun. 13, 2023

(65) Prior Publication Data

US 2024/0097699 A1 Mar. 21, 2024

(30) Foreign Application Priority Data

Sep. 13, 2022 (JP) ................................ 2022-145575

(51) Int. Cl.
*H03M 1/00* (2006.01)
*H03M 1/14* (2006.01)
(Continued)

(52) U.S. Cl.
CPC ............. *H03M 1/466* (2013.01); *H03M 1/14* (2013.01); *H03M 1/462* (2013.01); *H03M 1/121* (2013.01)

(58) Field of Classification Search
CPC .... H03M 1/468; H03M 1/002; H03M 1/0604; H03M 1/1215; H03M 1/1245; H03M 1/0845; H03M 1/12; H03M 1/168; H03M 1/38; H03M 1/0612; H03M 1/0639; H03M 1/0678; H03M 1/0863; H03M 1/089; H03M 1/1009; H03M 1/1033; H03M 1/1038;
(Continued)

(56) References Cited

U.S. PATENT DOCUMENTS 9,208,739 B2 * 12/2015 Wu ...................... G09G 3/3677
9,602,116 B1 * 3/2017 Le ........................ H03M 1/1038
(Continued)

FOREIGN PATENT DOCUMENTS

JP   6696953 B2   5/2020
JP   6944047 B2   10/2021
JP   6970597 B2   11/2021

OTHER PUBLICATIONS

Y. Zhu et al., "An 11b 450 MS/s Three-Way Time-Interleaved Subranging Pipelined-SAR ADC in 65 nm CMOS", IEEE Journal of Solid-State Circuits, pp. 1223-1234, 2016.
(Continued)

*Primary Examiner* — Linh V Nguyen
(74) *Attorney, Agent, or Firm* — Maier & Maier, PLLC

(57) ABSTRACT

According to one embodiment, a semiconductor integrated circuit includes: first and second converters respectively configured to determine first and second bit strings based on first and second clock signals; a circuit. The circuit includes: first, second, and third capacitors; first and second switching elements; and first, second, and third buffers. The first buffer includes an output end coupled to the first capacitor, a first end of the each of the first and second switching elements. The second buffer includes an output end coupled to the second capacitor, a second end of the first switching element, and the first converter. The third buffer includes an output end coupled to the third capacitor, a second end of the second switching element, and the second converter. A reference voltage is supplied to an input end of each of the first, second, and third buffers.

18 Claims, 13 Drawing Sheets

(51) Int. Cl.
*H03M 1/46* (2006.01)
*H03M 1/12* (2006.01)

(58) Field of Classification Search
CPC ........ H03M 1/121; H03M 1/123; H03M 1/18;
H03M 1/46; H03M 1/462; H03M 1/466;
H03M 1/66; H03M 1/68; H03M 1/687;
H03M 1/76; H03M 1/765; H03M 1/785;
H03M 1/804
USPC .......................... 341/122, 144, 150, 155, 172
See application file for complete search history.

(56) References Cited

U.S. PATENT DOCUMENTS

| 10,122,376 | B2 | 11/2018 | Kalathil et al. | |
|---|---|---|---|---|
| 10,547,321 | B2 | 1/2020 | Vinje et al. | |
| 10,911,060 | B1* | 2/2021 | Neto | G11C 27/02 |
| 11,910,198 | B2* | 2/2024 | Grippo | H04W 12/40 |
| 2007/0188367 | A1* | 8/2007 | Yamada | H03M 1/123 |
| | | | | 341/155 |
| 2013/0249727 | A1* | 9/2013 | Hurrell | H03F 3/45 |
| | | | | 341/172 |
| 2015/0311913 | A1* | 10/2015 | Pan | H03M 1/38 |
| | | | | 327/390 |
| 2018/0231997 | A1* | 8/2018 | Stanzione | G05F 3/08 |
| 2020/0195265 | A1* | 6/2020 | Ali | H03H 7/42 |
| 2021/0297623 | A1* | 9/2021 | Ikeda | H04N 25/766 |

OTHER PUBLICATIONS

X. Tang et al., "A 10-bit 100-MS/s SAR Adc with Always-on Reference Ripple Cancellation", IEEE Symposium on VLSI Circuits, 2020.

* cited by examiner

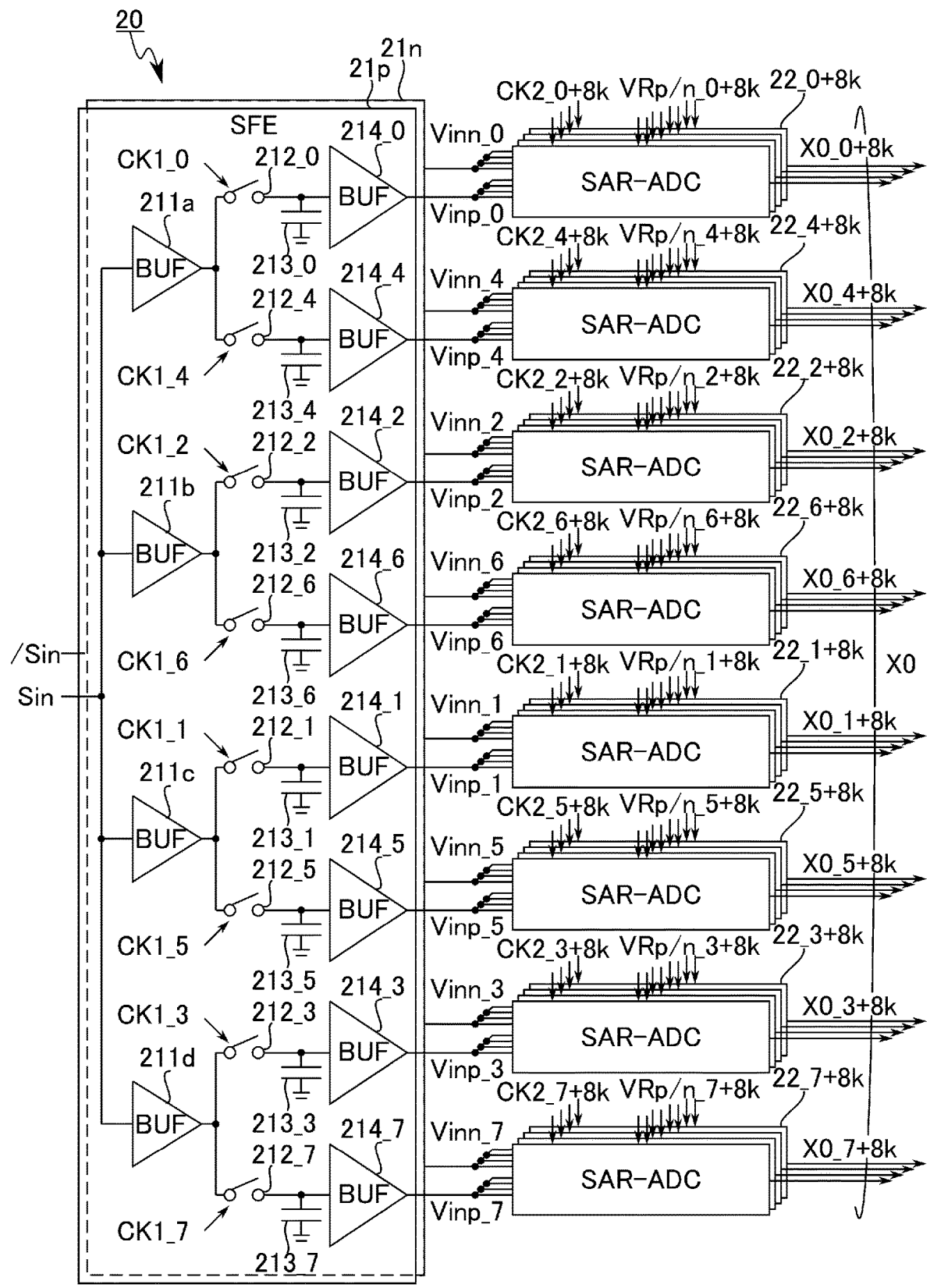
F I G. 3

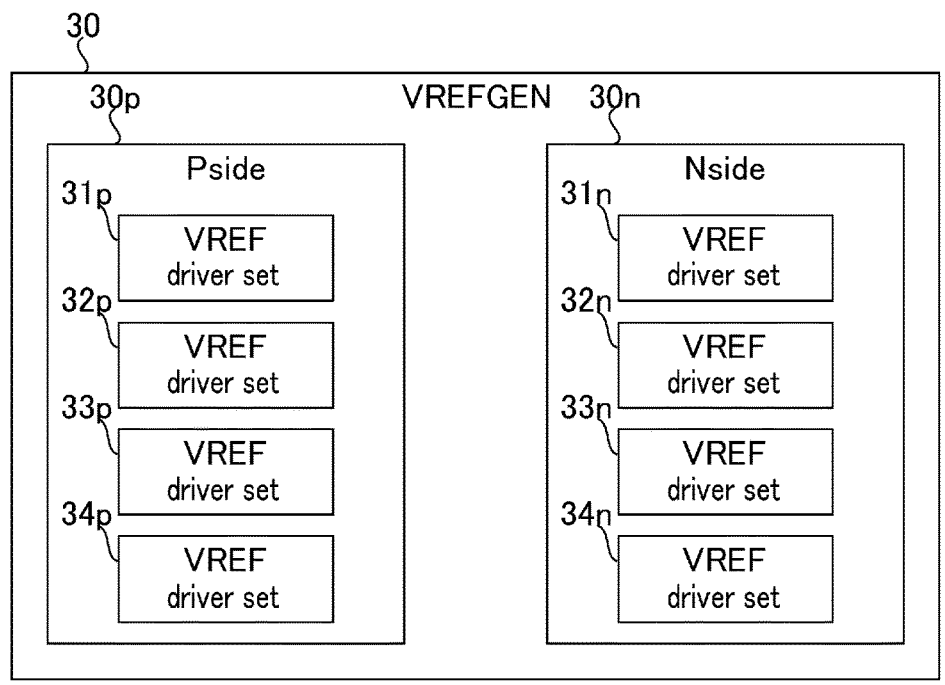
F I G. 5
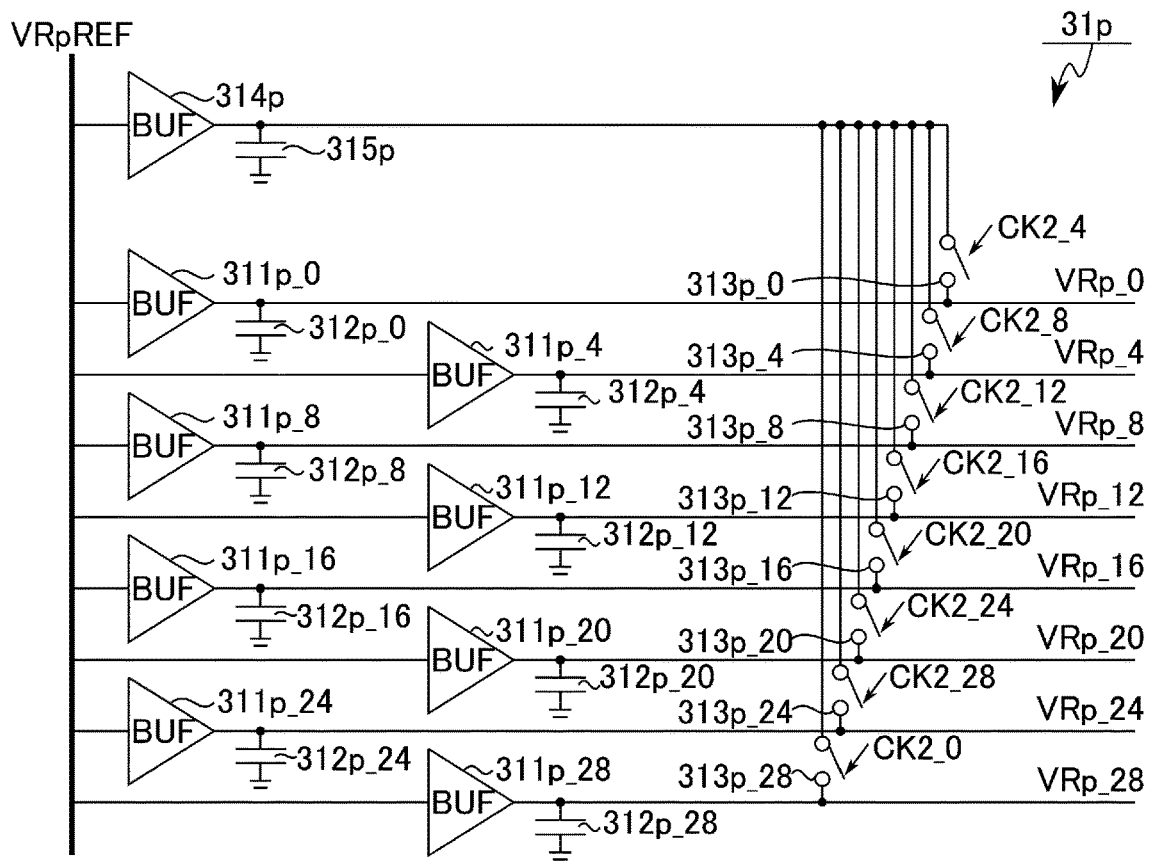
F I G. 6

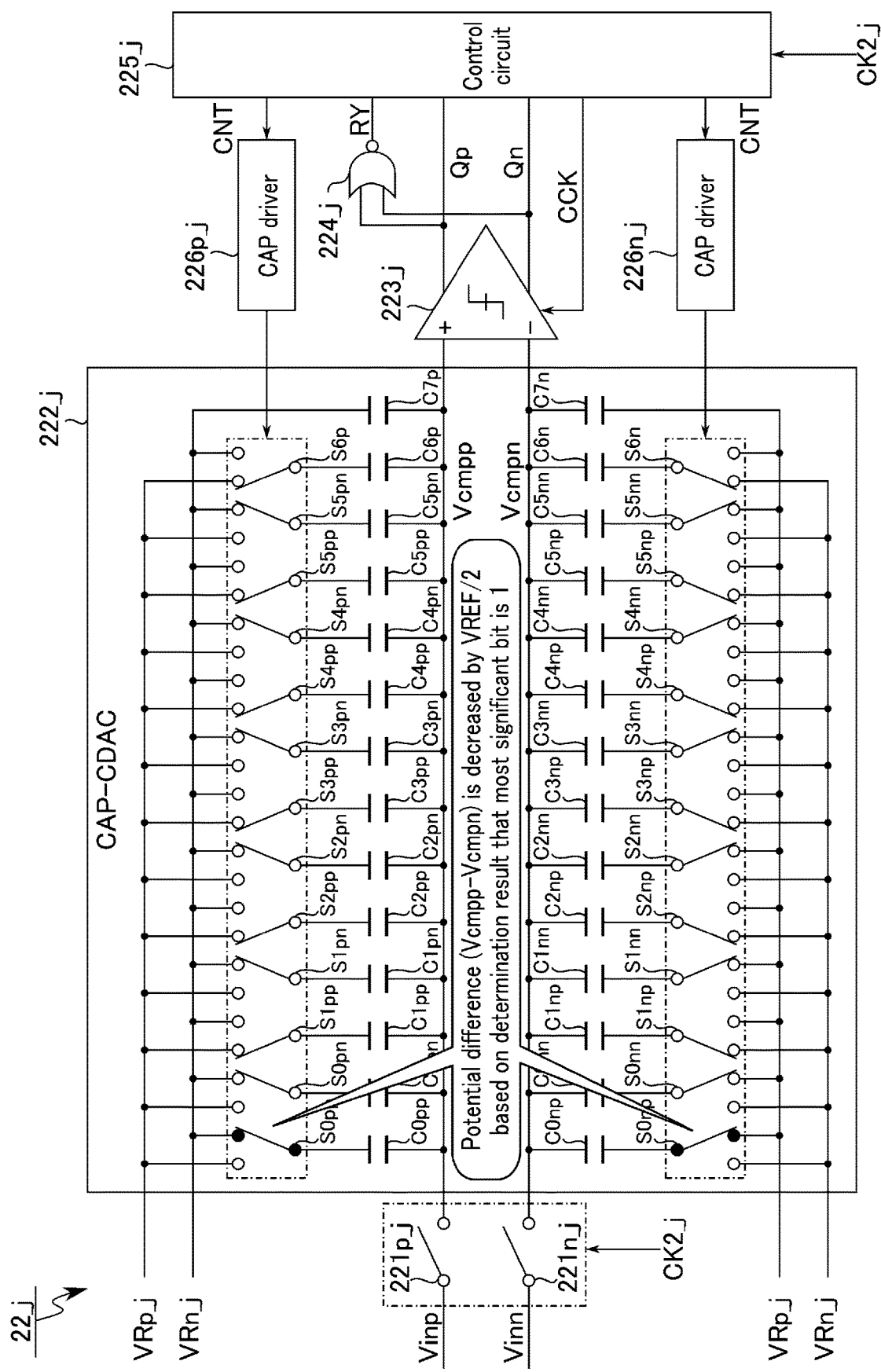
F I G. 9

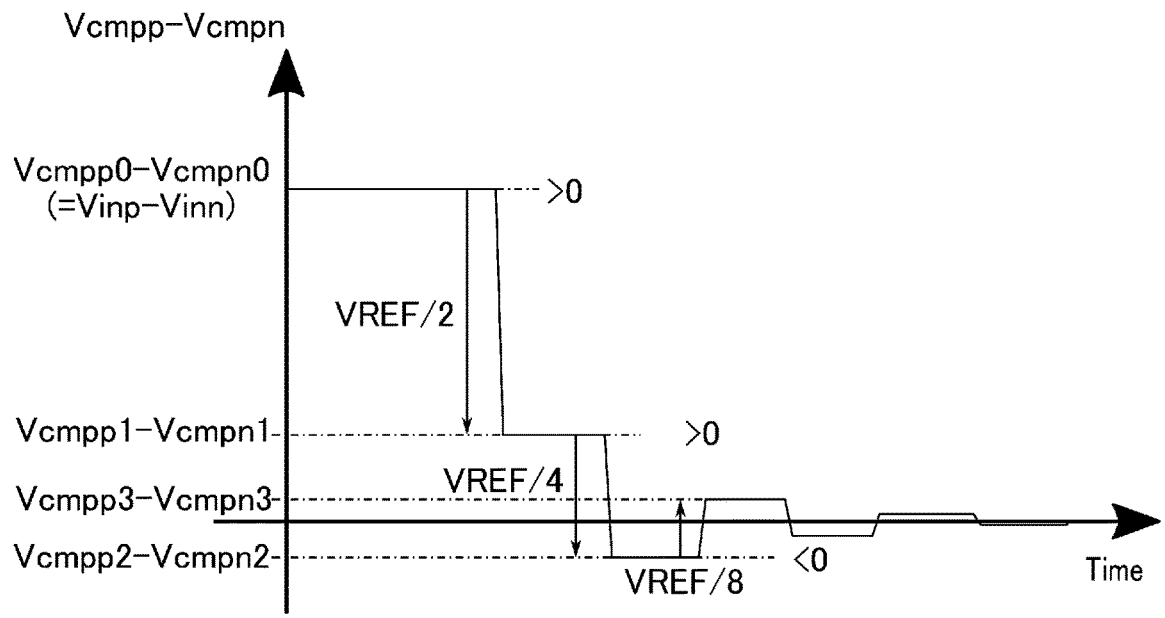
F I G. 12
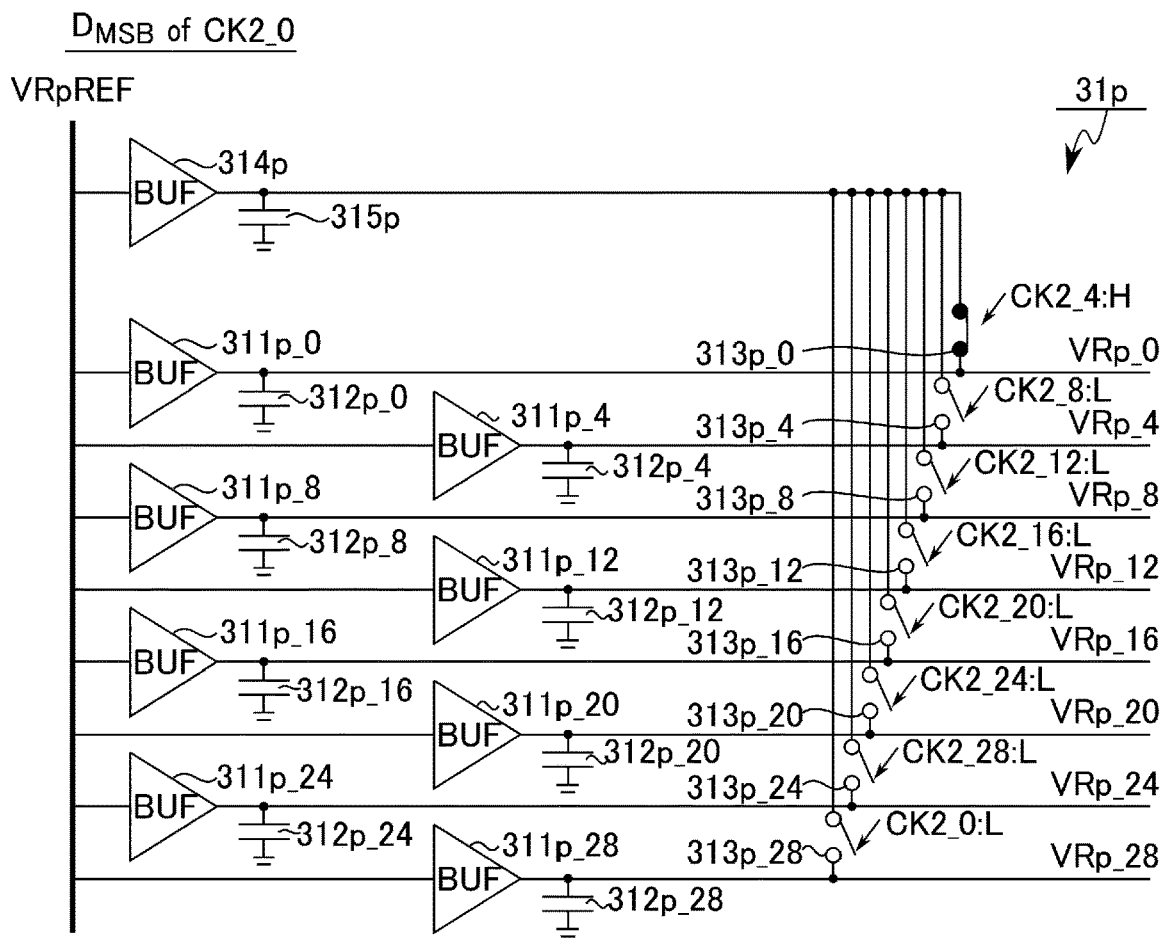
F I G. 13

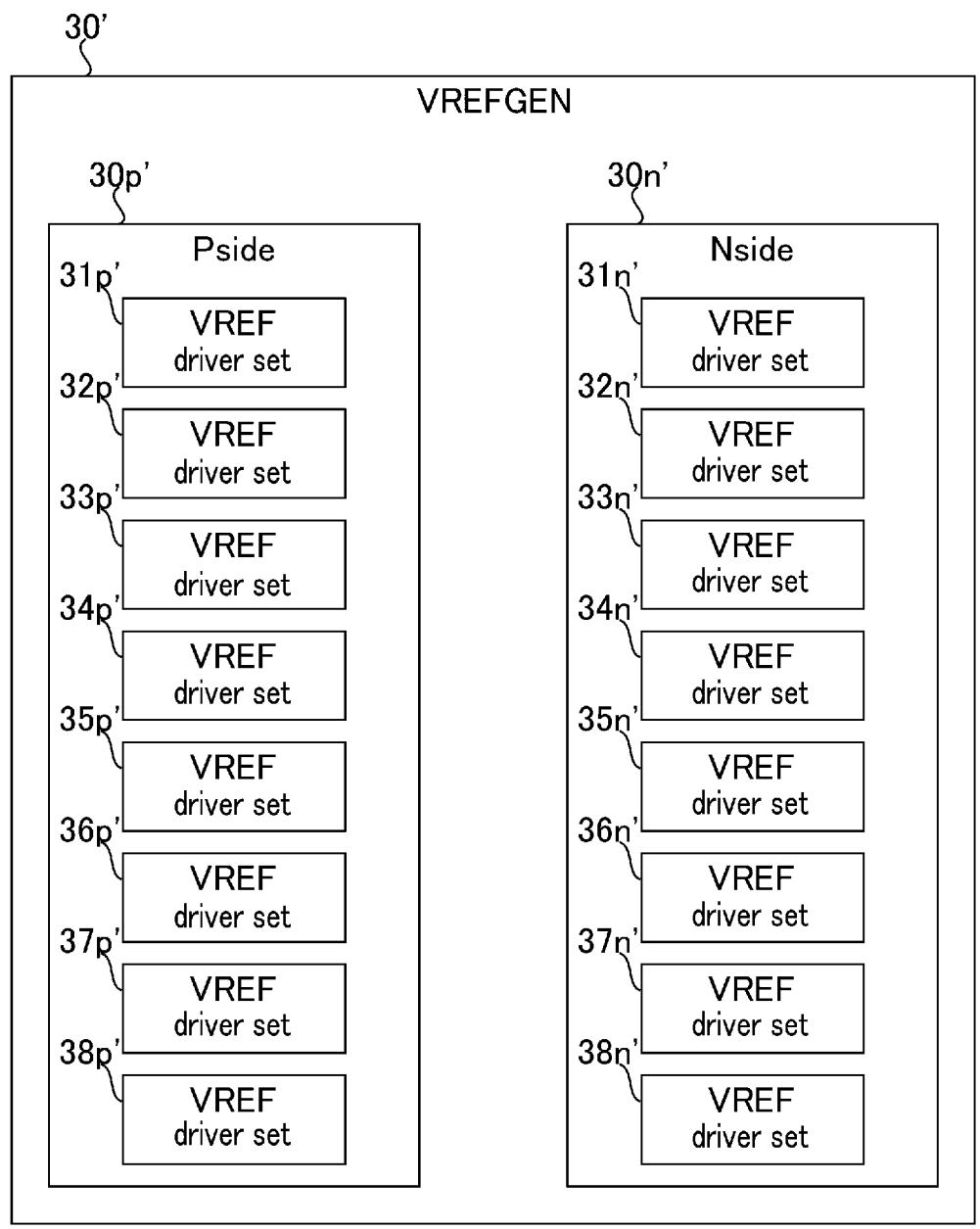
F I G. 15

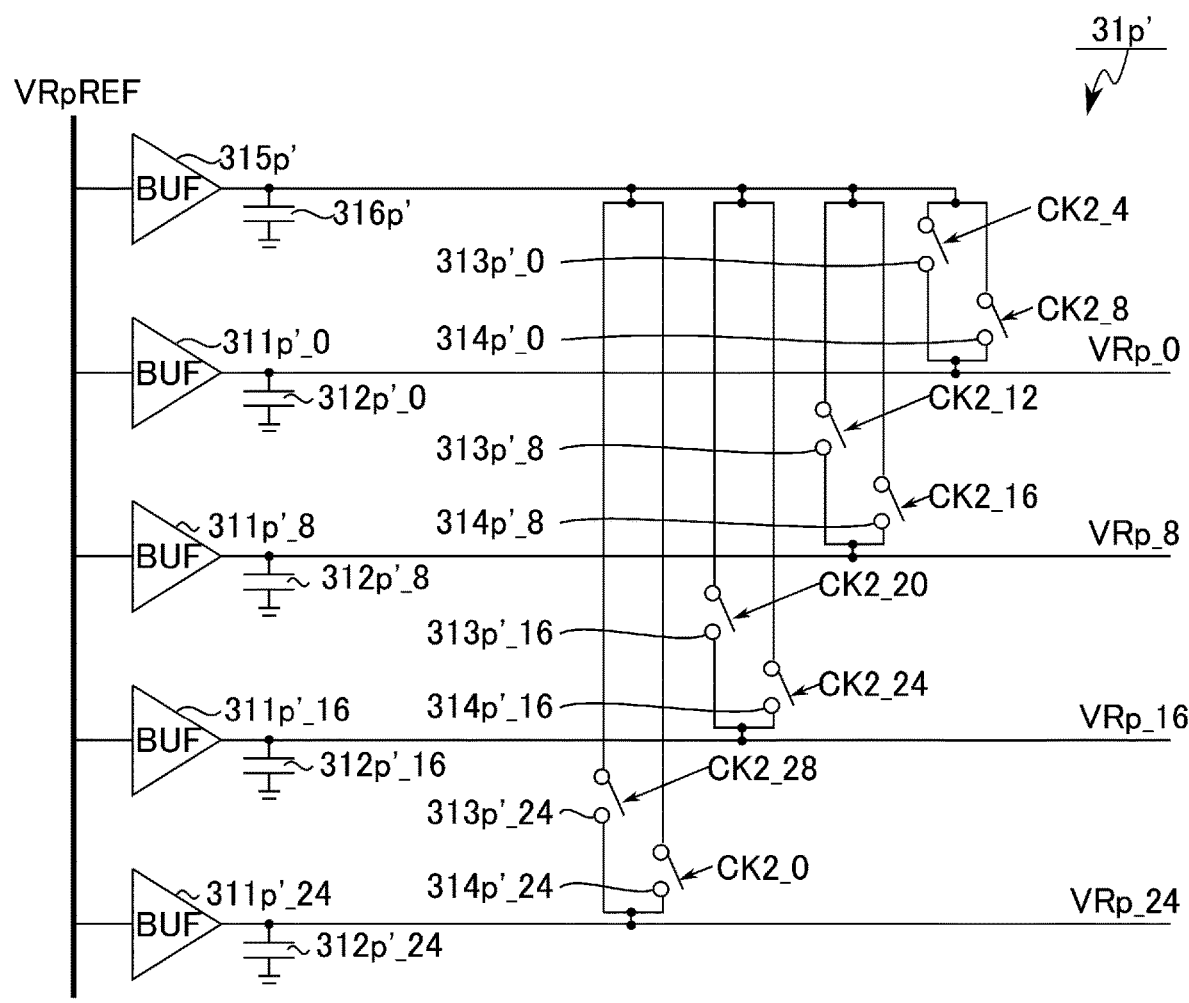
F I G. 16

SEMICONDUCTOR INTEGRATED CIRCUIT AND RECEIVER DEVICE

CROSS-REFERENCE TO RELATED APPLICATIONS

This application is based upon and claims the benefit of priority from Japanese Patent Application No. 2022-145575, filed Sep. 13, 2022, the entire contents of which are incorporated herein by reference.

FIELD

Embodiments described herein relate generally to a semiconductor integrated circuit and a receiver device.

BACKGROUND

A transmitter device and a receiver device are coupled via a transmission line. The transmitter device superimposes data on an analog signal. The receiver device receives the analog signal that has passed through the transmission line. The receiver device includes a semiconductor integrated circuit that processes the analog signal. The receiver device generates a digital signal based on the analog signal. The receiver device recovers the data based on the generated digital signal.

BRIEF DESCRIPTION OF THE DRAWINGS

FIG. 3 is a block diagram showing an example of a configuration of an AD converter of the receiver circuitry according to the embodiment.

FIG. 5 is a block diagram showing an example of a configuration of a reference voltage generator of the receiver circuitry according to the embodiment.

FIG. 6 is a block diagram showing an example of a configuration of a VREF driver set of the reference voltage generator according to the embodiment.

FIG. 9 is a diagram showing an example of a potential difference changing process based on a most significant bit determined by the determination process in the receiver device according to the embodiment.

FIG. 12 is a timing chart showing an example of a transition of a potential difference to be a determination target in the determination process in the receiver device according to the embodiment.

FIG. 13 is a diagram showing an example of a reference voltage supplying process in the receiver device according to the embodiment.

FIG. 15 is a block diagram showing an example of a configuration of a reference voltage generator of receiver circuitry according to a modification.

FIG. 16 is a block diagram showing an example of a configuration of a VREF driver set of the reference voltage generator according to a modification.

DETAILED DESCRIPTION

Figure 1:
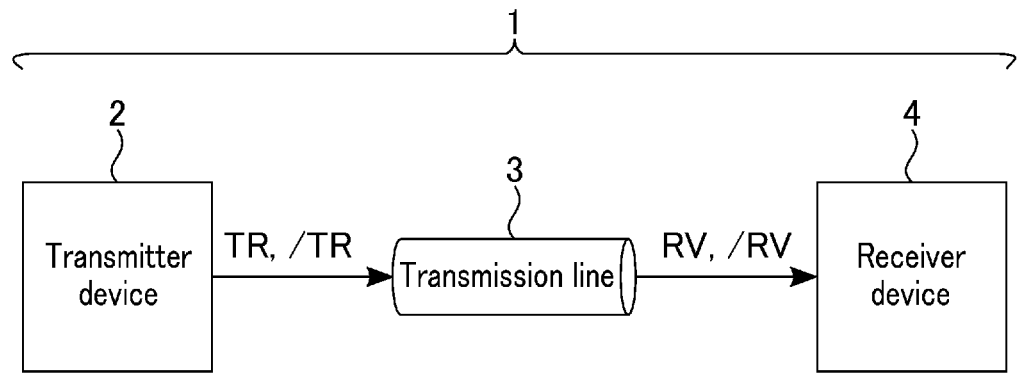
FIG. 1 is a block diagram showing an example of a configuration of a communication system including a receiver device according to an embodiment.

In general, according to one embodiment, a semiconductor integrated circuit includes: a first converter configured to determine a first bit string from an analog signal based on a first clock signal; a second converter configured to determine a second bit string from the analog signal based on a second clock signal shifted from the first clock signal by a first phase; and a circuit configured to supply a reference voltage to the first converter and the second converter. The circuit includes: a first capacitor; a second capacitor; a third capacitor; a first switching element; a second switching element; a first buffer; a second buffer; and a third buffer. The first buffer includes: an input end to which a voltage corresponding to the reference voltage is supplied; and an output end coupled to the first capacitor, a first end of the first switching element, and a first end of the second switching element; The second buffer includes: an input end to which the voltage corresponding to the reference voltage is supplied; and an output end coupled to the second capacitor, a second end of the first switching element, and the first converter. The third buffer includes: an input end to which the voltage corresponding to the reference voltage is supplied; and an output end coupled to the third capacitor, a second end of the second switching element, and the second converter.

Hereinafter, embodiments will be described with reference to the drawings.

In the description that follows, components having approximately the same function and configuration will be assigned an identical reference numeral. To particularly distinguish components with a similar configuration, such components may be referred to by an identical reference numeral with different characters or numbers added at the end.

1. Configuration

A configuration according to an embodiment will be described.

1.1 Communication System

A description will be given of a configuration of a communication system including a receiver device according to the embodiment. FIG. 1 is a block diagram showing an example of a configuration of the communication system including the receiver device according to the embodiment.

A communication system 1 is configured to transmit data from one device or circuit to another device or circuit by means of high-speed serial communications. The communication system 1 includes a transmitter device 2, a transmission line 3, and a receiver device 4. The communication system 1 may be configured of a plurality of devices or circuits provided on the same printed substrate, or may be configured of a plurality of devices or circuits provided on different printed substrates.

The transmitter device 2 is configured to transmit signals TR and /TR to the receiver device 4 via the transmission line 3. The signals TR and /TR are differential signals. The signals TR and /TR are, for example, signals including a plurality of pulse signals. Data is superimposed on each pulse of the signals TR and /TR. The voltage level of each pulse of the signals TR and /TR corresponds to data of one or more bits. The data superimposed on the pulse signals is conveyed from the transmitter device 2 to the receiver device 4 via the transmission line 3.

The transmission line 3 is a physical or spatial transmission medium for transmitting the signals TR and /TR to the receiver device 4. The transmission line 3 is, for example, an interconnect that couples the transmitter device 2 and the receiver device 4. The transmission line 3 may have various transmission properties according to the physical structure, material, etc. of the transmission medium. The transmission properties of the transmission line 3 include, for example, frequency properties that involve loss of a gain in a specific frequency range.

The signals TR and /TR transmitted from the transmitter device 2 pass through the transmission line 3, and suffer a loss according to the transmission properties of the transmission line 3. Thereby, an inter-symbol interference (ISI) appears in the signals TR and /TR that have passed through the transmission line 3. Accordingly, the signals TR and /TR that have passed through the transmission line 3 are processed as analog signals. Hereinafter, the signals TR and /TR that have passed through the transmission line 3 and suffered a loss will be referred to as "signals RV and /RV".

The receiver device 4 is configured to receive the signals RV and /RV from the transmitter device 2 via the transmission line 3. The receiver device 4 decodes the data superimposed on the signals TR and /TR by the transmitter device 2 based on the signals RV and /RV. The receiver device 4 includes receiver circuitry for correctly decoding the data superimposed on the signals TR and /TR. The receiver circuitry may also be referred to as a "semiconductor integrated circuit".

1.2 Receiver Circuitry

Figure 2:
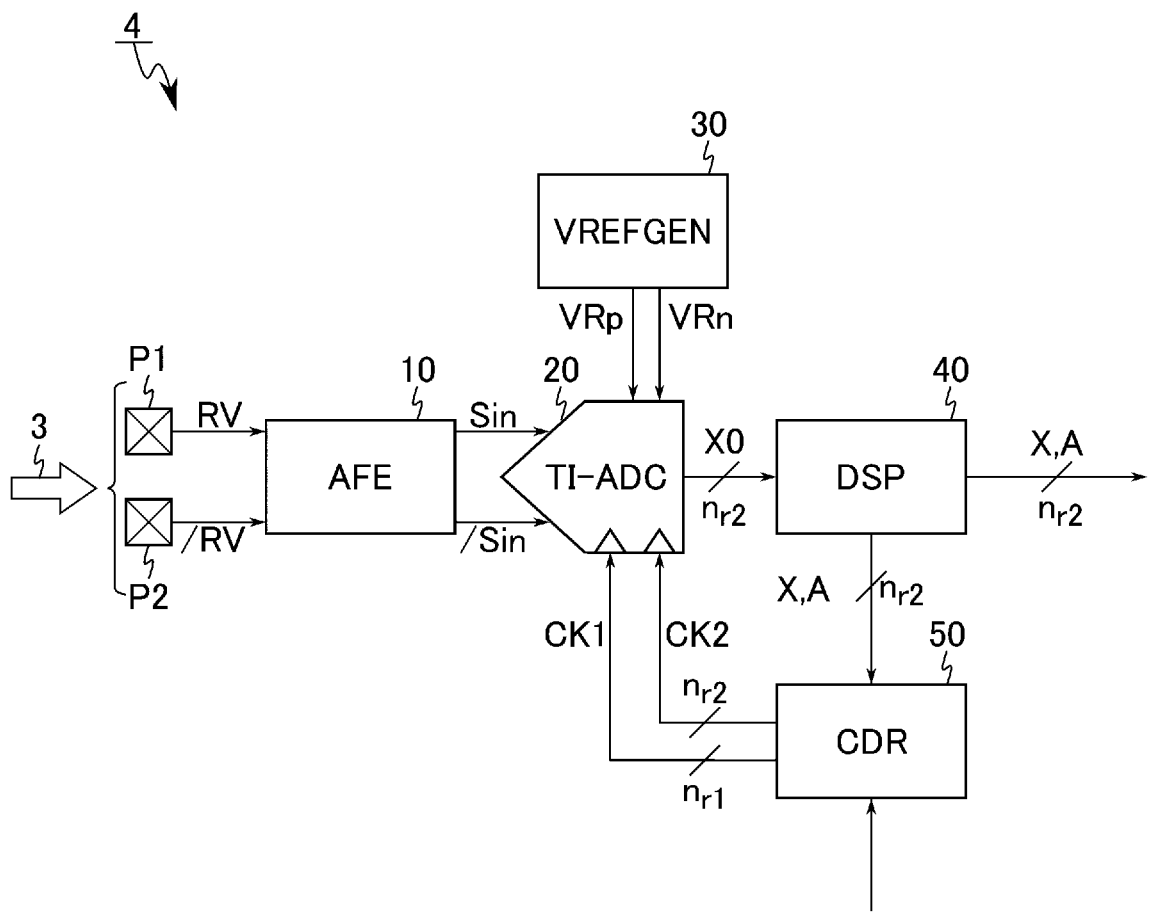
FIG. 2 is a block diagram showing an example of a configuration of receiver circuitry of the receiver device according to the embodiment.

FIG. 2 is a block diagram showing an example of a configuration of the receiver circuitry of the receiver device according to the embodiment.

The receiver device 4 includes, as the receiver circuitry, for example, pads P1 and P2, an AFE 10, a TI-ADC 20, a VREFGEN 30, a DSP 40, and a CDR 50.

Each of the pads P1 and P2 is a terminal configured to be coupled to the transmission line 3. In the example of FIG. 2, a case is shown where the pads P1 and P2 receive signals RV and /RV, respectively, from the transmitter device 2 via the transmission line 3.

The AFE 10 is an analog front-end. The AFE 10 includes, for example, a continuous time linear equalizer (CTLE) and a variable gain amplifier (VGA). The CTLE is an amplifier circuit having frequency properties that compensate for the frequency properties of the transmission line 3. The VGA is an amplifier circuit capable of varying its gain. The signals RV and /RV are input to the AFE 10 from the pads P1 and P2, respectively. The AFE 10 performs an analog process on the signals RV and /RV using the CTLE and the VGA. The AFE 10 generates signals Sin and /Sin based on the signals RV and /RV. That is, the signals Sin and /Sin are analog signals, similarly to the signals RV and /RV. The AFE 10 outputs the signals Sin and /Sin to the TI-ADC 20.

The TI-ADC 20 is a time-interleaved analog-to-digital (AD) converter. That is, the TI-ADC 20 executes a process of converting an analog signal into a digital signal. The signals Sin and /Sin are input to the TI-ADC 20 from the AFE 10. Reference voltages VRp and VRn are input to the TI-ADC 20 from the VREFGEN 30. Signals CK1 and CK2 are input to the TI-ADC 20 from the CDR 50. Based on the reference voltages VRp and VRn and the signals CK1 and CK2, the TI-ADC 20 converts the signals Sin and /Sin into a signal X0. The TI-ADC 20 outputs the signal X0 to the DSP 40. A configuration of the TI-ADC 20 will be discussed later.

The reference voltages VRp and VRn are voltages used in a process for converting the analog signal into the digital signal in the TI-ADC 20. The TI-ADC 20 generates the signal X0 based on a magnitude relationship between a potential difference between the signals Sin and /Sin and a potential difference between the reference voltages VRp and VRn (VRp−VRn). Hereinafter, the potential difference between the reference voltages VRp and VRn (VRp−VRn) will also be referred to as a "reference voltage VREF".

The signal CK1 includes $n_{r1}$ clock signals. Here, $n_{r1}$ is an integer equal to or greater than 1 (e.g., 8). The $n_{r1}$ clock signals of the signal CK1 differ in phase by, for example, at least $360°/n_{r1}$. Hereinafter, the $n_{r1}$ clock signals of the signal CK1 may also be denoted as, for example, "signals CK1_0, . . . , and CK1_($n_{r1}$−1)" for distinction. The frequency of the signal CK1 is lower than the frequency of a clock signal embedded in the signals TR and /TR by the transmitter device 2.

The signal CK2 includes $n_{r2}$ clock signals. Here, $n_{r2}$ is an integer greater than $n_{r1}$ (e.g., 32). The $n_{r2}$ clock signals of the signal CK2 differ in phase by, for example, at least $360°/n_{r2}$. Hereinafter, the $n_{r2}$ clock signal signals in the signal CK2 may also be denoted as, for example, "signals CK2_0, . . . , and CK2_($n_{r2}$−1)" for distinction. The frequency of the signal CK2 may be equal to the frequency of the clock signal embedded in the signals TR and /TR by the transmitter device 2. The frequency of the signal CK2 may be different from the frequency of the clock signal embedded in the signals TR and /TR by the transmitter device 2.

The signal X0 output from the TI-ADC 20 is a digital signal. The signal X0 includes a plurality of continuous digital values. One digital value included in the signal X0 is sampled from one corresponding symbol of the signals Sin and /Sin based on one corresponding clock signal of the signal CK2. Each digital value is, for example, 8-bit data. The value of each bit of $n_{r2}$ continuous digital values included in the signal X0 is sampled from $n_{r2}$ continuous symbols of the signals Sin and /Sin based on $n_{r2}$ clock signals of the signal CK2. Hereinafter, a cycle of generation by the TI-ADC 20 of $n_{r2}$ continuous digital values to be included in the signal X0 will also be simply referred to as a "cycle". The $n_{r2}$ continuous digital values included in the signal X0 will also be referred to as a "single-cycle signal X0".

Also, the $n_{r2}$ continuous digital values included in the signal X0 may also be denoted as, for example, "digital value X0_0, . . . , and X0_($n_{r2}$−1)" for distinction. An 8-bit data string included in a digital value X0_j may also be denoted as, for example, a "bit string X0_j<0:7>" ($0 \leq j \leq n_{r2}-1$). The bit string X0_j<0:7> refers to a data string in which eight bits from a most significant bit (MSB) X0_j<0> to a least significant bit (LSB) X0_j<7> are arranged in order.

The VREFGEN 30 is a voltage generator or a voltage generating circuit. The VREFGEN 30 is configured to generate the reference voltages VRp and VRn. Details of the configuration of the VREFGEN 30 will be discussed later.

The DSP 40 is a digital signal processor. The DSP 40 includes, for example, a feed-forward equalizer (FFE), a decision feedback equalizer (DFE), and a data determination circuit. A signal X0 is input to the DSP 40. The DSP 40 executes a digitization process on the signal X0 using the FFE, the DFE, and the data determination circuit. Specifically, the DSP 40 generates a signal X and data A based on the signal X0. The DSP 40 outputs the signal X and the data A to the CDR 50. The DSP 40 outputs the signal X and the data A to a subsequent processing circuit (not illustrated). In the subsequent processing circuit, the signal X and the data A are processed. The signal X and the data A output to the CDR 50 and the signal X and the data A output to the subsequent processing circuit (not illustrated) may be either the same or different.

The signal X is a digital signal, similarly to the signal X0. A single-cycle signal X is a set of $n_{r2}$ digital values. The data A is data decoded based on the signal X.

The CDR 50 is a clock data recovery circuit. The signal X and the data A are input to the CDR 50 at every cycle. A reference clock signal CKREF is input to the CDR 50 from, for example, the transmitter device 2. The reference clock signal CKREF may be generated inside the CDR 50 or inside the receiver device 4, independently from the transmitter device 2. The CDR 50 calculates an amount of phase correction of the signals CK1 and CK2 based on the reference clock signal CKREF, the signal X, and the data A. The CDR 50 recovers the signals CK1 and CK2 based on the calculated amount of phase correction. The CDR 50 outputs the recovered signals CK1 and CK2 to the TI-ADC 20 at every cycle. In this manner, the CDR 50 recovers, based on the signal X and the data A generated from a single-cycle signal X0, signals CK1 and CK2, on which the timing of sampling of a subsequent single-cycle signal X0 is based. Such a cycle-by-cycle circulation process by the TI-ADC 20, the DSP 40, and the CDR 50 is also referred to as a "CDR loop".

Hereinafter, a case where (8, 32) is applied as a specific combination of ($n_{r1}$, $n_{r2}$) will be described.

1.3 AD Converter

Next, an internal configuration of the AD converter (TI-ADC) of the receiver circuitry according to the embodiment will be described. FIG. 3 is a block diagram showing an example of a configuration of the AD converter of the receiver circuitry according to the embodiment.

The TI-ADC 20 includes SFEs 21p and 21n, and a plurality of SAR-ADCs 22. The plurality of SAR-ADCs 22 include 32 SAR-ADCs 22_0, . . . , and 22_31. In the example of FIG. 3, four SAR-ADCs 22_0, 22_8, 22_16, and 22_24 are denoted as "SAR-ADCs 22_0+8k" (0≤k≤3). Similarly, four SAR-ADCs 22_1, 22_9, 22_17, and 22_25 are denoted as "SAR-ADCs 22_1+8k". Four SAR-ADCs 22_2, 22_10, 22_18, and 22_26 are denoted as "SAR-ADCs 22_2+8k". Four SAR-ADCs 22_3, 22_11, 22_19, and 22_27 are denoted as "SAR-ADCs 22_3+8k". Four SAR-ADCs 22_4, 22_12, 22_20, and 22_28 are denoted as "SAR-ADCs 22_4+8k". Four SAR-ADCs 22_5, 22_13, 22_21, and 22_29 are denoted as "SAR-ADCs 22_5+8k". Four SAR-ADCs 22_6, 22_14, 22_22, and 22_30 are denoted as "SAR-ADCs 22_6+8k". Four SAR-ADCs 22_7, 22_15, 22_23, and 22_31 are denoted as "SAR-ADCs 22_7+8k".

Each of the SFEs 21p and 21n is a sampling front end. A signal Sin is input to the SFE 21p from the AFE 10. The SFE 21p generates a plurality of voltages Vinp based on the signal Sin, and outputs the generated voltages Vinp to the corresponding SAR-ADCs 22. The plurality of voltages Vinp include eight voltages Vinp_0, Vinp_1, Vinp_2, Vinp_3, Vinp_4, Vinp_5, Vinp_6, and Vinp_7. A signal /Sin is input to the SFE 21n from the AFE 10. The SFE 21n generates a plurality of voltages Vinn based on the signal /Sin, and outputs the generated voltages Vinn to the corresponding SAR-ADCs 22. The plurality of voltages Vinn include eight voltages Vinn_0, Vinn_1, Vinn_2, Vinn_3, Vinn_4, Vinn_5, Vinn_6, and Vinn_7. The SFEs 21p and 21n may have equivalent configurations. Hereinafter, a description will be given mainly of the configuration of the SFE 21p.

The SFE 21p includes a plurality of buffers 211, a plurality of switching elements 212, a plurality of capacitors 213, and a plurality of buffers 214. The plurality of buffers 211 include four buffers 211a, 211b, 211c, and 211d. The plurality of switching elements 212 include eight switching elements 212_0, 212_1, 212_2, 212_3, 212_4, 212_5, 212_6, and 212_7. The plurality of capacitors 213 include eight capacitors 213_0, 213_1, 213_2, 213_3, 213_4, 213_5, 213_6, and 213_7. The plurality of buffers 214 include eight buffers 214_0, 214_1, 214_2, 214_3, 214_4, 214_5, 214_6, and 214_7. Each of the plurality of switching elements 212 includes, for example, a transistor.

At the SFE 21p, a signal Sin is input to an input end of each of the buffers 211a, 211b, 211c, and 211d. At the SFE 21n, a signal /Sin is input to an input end of each of the buffers 211a, 211b, 211c, and 211d. A first end of each of the switching elements 212_0 and 212_4 is coupled to an output end of the buffer 211a. A first end of each of the switching elements 212_2 and 212_6 is coupled to an output end of the buffer 211b. A first end of each of the switching elements 212_1 and 212_5 is coupled to an output end of the buffer 211c. A first end of each of the switching elements 212_3 and 212_7 is coupled to an output end of the buffer 211d.

A first end of the capacitor 213_0 and an input end of the buffer 214_0 are coupled to a second end of the switching element 212_0. A second end of the capacitor 213_0 is grounded. Being "grounded" means being coupled to an interconnect to which a reference potential at the time of operation of the SFE 21p is applied. If the signal CK1_0 is at an "H" level, the switching element 212_0 is brought to an on state. If the signal CK1_0 is at an "L" level, the switching element 212_0 is brought to an off state.

A first end of the capacitor 213_1 and an input end of the buffer 214_1 are coupled to a second end of the switching element 212_1. A second end of the capacitor 213_1 is grounded. If the signal CK1_1 is at the "H" level, the switching element 212_1 is brought to an on state. If the signal CK1_1 is at the "L" level, the switching element 212_1 is brought to an off state.

A first end of the capacitor 213_2 and an input end of the buffer 214_2 are coupled to a second end of the switching element 212_2. A second end of the capacitor 213_2 is grounded. If the signal CK1_2 is at the "H" level, the switching element 212_2 is brought to an on state. If the signal CK1_2 is at the "L" level, the switching element 212_2 is brought to an off state.

A first end of the capacitor 213_3 and an input end of the buffer 214_3 are coupled to a second end of the switching element 212_3. A second end of the capacitor 213_3 is grounded. If the signal CK1_3 is at the "H" level, the switching element 212_3 is brought to an on state. If the signal CK1_3 is at the "L" level, the switching element 212_3 is brought to an off state.

A first end of the capacitor 213_4 and an input end of the buffer 214_4 are coupled to a second end of the switching element 212_4. A second end of the capacitor 213_4 is grounded. If the signal CK1_4 is at the "H" level, the switching element 212_4 is brought to an on state. If the signal CK1_4 is at the "L" level, the switching element 212_4 is brought to an off state.

A first end of the capacitor 213_5 and an input end of the buffer 214_5 are coupled to a second end of the switching element 212_5. A second end of the capacitor 213_5 is grounded. If the signal CK1_5 is at the "H" level, the switching element 212_5 is brought to an on state. If the signal CK1_5 is at the "L" level, the switching element 212_5 is brought to an off state.

A first end of the capacitor 213_6 and an input end of the buffer 214_6 are coupled to a second end of the switching element 212_6. A second end of the capacitor 213_6 is grounded. If the signal CK1_6 is at the "H" level, the switching element 212_6 is brought to an on state. If the signal CK1_6 is at the "L" level, the switching element 212_6 is brought to an off state.

A first end of the capacitor 213_7 and an input end of the buffer 214_7 are coupled to a second end of the switching element 212_7. A second end of the capacitor 213_7 is grounded. If the signal CK1_7 is at the "H" level, the switching element 212_7 is brought to an on state. If the signal CK1_7 is at the "L" level, the switching element 212_7 is brought to an off state.

With the above-described configuration, at the SFE 21$p$, the voltages Vinp_0 to Vinp_7 corresponding to the signal Sin at a timing when the signals CK1_0 to CK1_7 are brought to the "H" level are sequentially stored into the buffers 214_0 to 214_7, respectively. Similarly, at the SFE 21$n$, the voltages Vinn_0 to Vinn_7 corresponding to the signal /Sin at a timing when the signals CK1_0 to CK1_7 are brought to the "H" level are sequentially stored into the buffers 214_0 to 214_7, respectively.

An output end of the buffer 214_0 of each of the SFEs 21$p$ and 21$n$ is coupled to the SAR-ADCs 22_0, 22_8, 22_16, and 22_24. An output end of the buffer 214_1 of each of the SFEs 21$p$ and 21$n$ is coupled to the SAR-ADCs 22_1, 22_9, 22_17, and 22_25. An output end of the buffer 214_2 of each of the SFEs 21$p$ and 21$n$ is coupled to the SAR-ADCs 22_2, 22_10, 22_18, and 22_26. An output end of the buffer 214_3 of each of the SFEs 21$p$ and 21$n$ is coupled to the SAR-ADCs 22_3, 22_11, 22_19, and 22_27. An output end of the buffer 214_4 of each of the SFEs 21$p$ and 21$n$ is coupled to the SAR-ADCs 22_4, 22_12, 22_20, and 22_28. An output end of the buffer 214_5 of each of the SFEs 21$p$ and 21$n$ is coupled to the SAR-ADCs 22_5, 22_13, 22_21, and 22_29. An output end of the buffer 214_6 of each of the SFEs 21$p$ and 21$n$ is coupled to the SAR-ADCs 22_6, 22_14, 22_22, and 22_30. An output end of the buffer 214_7 of each of the SFEs 21$p$ and 21$n$ is coupled to the SAR-ADCs 22_7, 22_15, 22_23, and 22_31.

Each of the SAR-ADCs 22_0 to 22_31 is a successive-approximation register AD converter. Signals CK2_0 to CK2_31 are respectively input to the SAR-ADCs 22_0 to 22_31. Reference voltages VRp and VRn are supplied to each of the SAR-ADCs 22_0 to 22_31 via different interconnects. The SAR-ADCs 22_0 to 22_31 respectively output signals X0_0 to X0_31 based on signals CK2_0 to CK2_31 respectively input thereto and the reference voltages VRp and VRn. The SAR-ADCs 22_0 to 22_31 have equivalent configurations.

It is to be noted that the reference voltages VRp and VRn may transiently ripple in level in accordance with operating statuses of the SAR-ADCs 22_0 to 22_31 to which the reference voltages VRp and VRn are supplied. Since the reference voltages VRp and VRn are supplied to each of the SAR-ADCs 22_0 to 22_31 via the different interconnects, as described above, the transient ripple can be assumed to occur independently in each of the SAR-ADCs 22_0 to 22_31. Hereinafter, if consideration is given to independently occurring ripples, the reference voltages VRp and VRn supplied to the SAR-ADCs 22_0 to 22_31 may be respectively denoted as, for example, reference voltages "VRp_0 to VRp_31" and "VRn_0 to VRn_31" for distinction.

1.4 SAR-ADC

Figure 4:
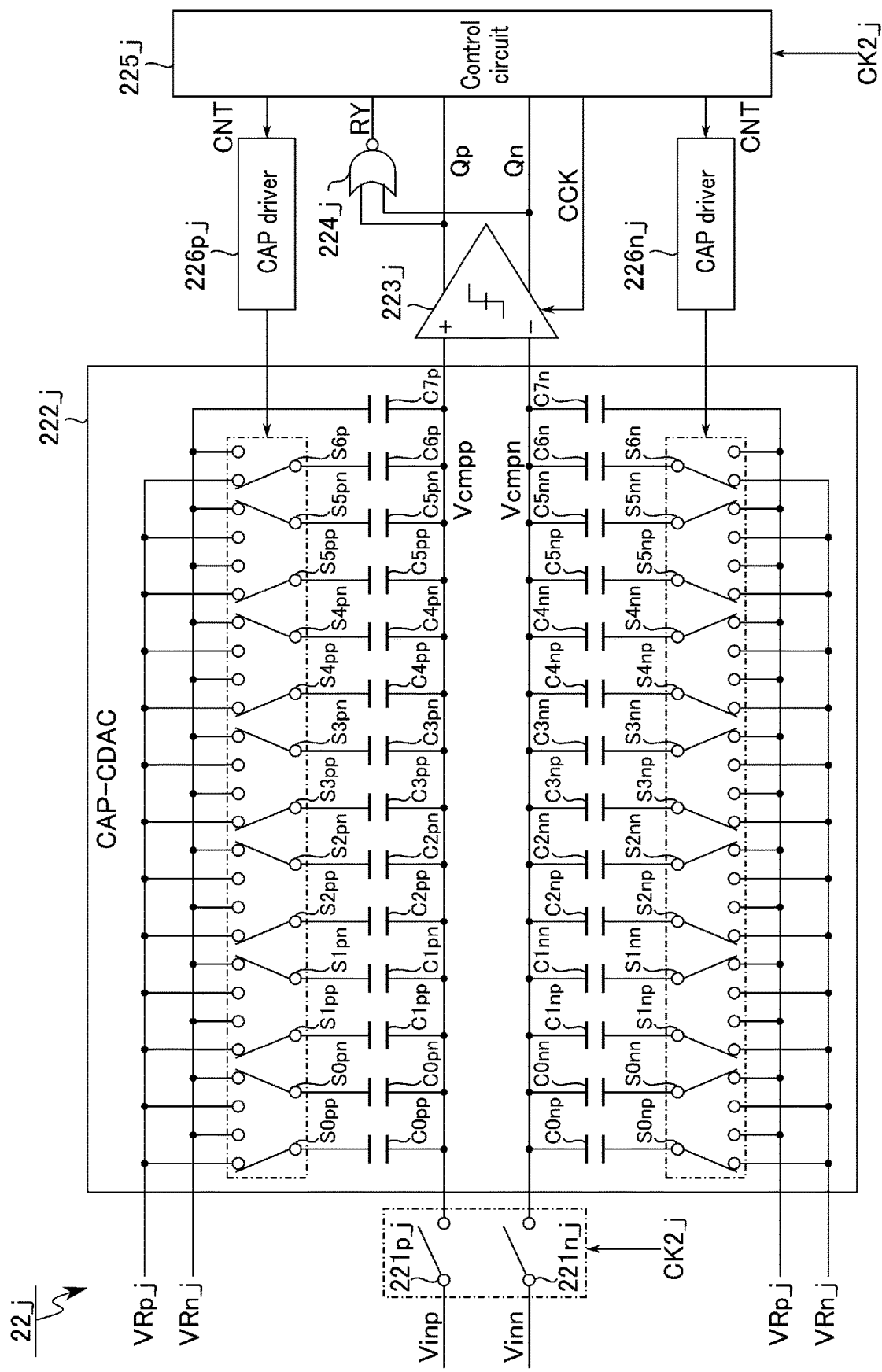
FIG. 4 is a block diagram showing an example of a configuration of a successive-approximation register AD converter in a TI-ADC according to the embodiment.

Next, an internal configuration of a successive-approximation register AD converter (SAR-ADC) in the TI-ADC according to the embodiment will be described. FIG. 4 is a block diagram showing an example of a configuration of a successive-approximation register AD converter in the TI-ADC according to the embodiment. In the example of FIG. 4, an example of a configuration of a given SAR-ADC 22_$j$ included in the 32 SAR-ADCs 22_0 to 22_31 is shown ($0 \leq j \leq n_{r2}-1=31$).

The SAR-ADC 22_$j$ is an SAR-ADC configured to perform determination of, for example, up to 8 bits. Hereinafter, a top-plate sampling asynchronous SAR-ADC will be described as an example. It is to be noted that the SAR-ADC 22_$j$ is not limited to the top-plate sampling asynchronous SAR-ADC, and a bottom-plate sampling asynchronous SAR-ADC or a synchronous SAR-ADC is also applicable.

The SAR-ADC 22_$j$ includes switching elements 221$p$_$j$ and 221$n$_$j$, a CAP-CDAC 222_$j$, a comparator 223_$j$, a NOR 224_$j$, a control circuit 225_$j$, and CAP drivers 226$p$_$j$ and 226$n$_$j$. The CAP-CDAC 222_$j$ includes a plurality of capacitors Cp and Cn, and a plurality of switching elements Sp and Sn. Each of the switching elements 221$p$_$j$ and 221$n$_$j$ and the switching elements Sp and Sn includes, for example, a transistor.

The plurality of capacitors Cp include 14 capacitors C0$pp$, C0$pn$, C1$pp$, C1$pn$, C2$pp$, C2$pn$, C3$pp$, C3$pn$, C4$pp$, C4$pn$, C5$pp$, C5$pn$, C6$p$, and C7$p$. The plurality of capacitors Cn include 14 capacitors C0$np$, C0$nn$, C1$np$, C1$nn$, C2$np$, C2$nn$, C3$np$, C3$nn$, C4$np$, C4$nn$, C5$np$, C5$nn$, C6$n$, and C7$n$. The capacitors C0$pp$, C0$pn$, C0$np$, and C0$nn$ are equal in capacitance. The capacitors C1$pp$, C1$pn$, C1$np$, and C1$nn$ are equal in capacitance. The capacitors C2$pp$, C2$pn$, C2$np$, and C2$nn$ are equal in capacitance. The capacitors C3$pp$, C3$pn$, C3$np$, and C3$nn$ are equal in capacitance. The capacitors C4$pp$, C4$pn$, C4$np$, and C4$nn$ are equal in capacitance. The capacitors C5$pp$, C5$pn$, C6$p$, C7$p$, C5$np$, C5$nn$, C6$n$, and C7$n$ are equal in capacitance.

Hereinafter, it is assumed that the capacitance of each of the capacitors C5$pp$, C5$pn$, C6$p$, C7$p$, C5$np$, C5$nn$, C6$n$, and C7$n$ is C. In this case, the capacitance of each of the capacitors C4$pp$, C4$pn$, C4$np$, and C4$nn$ is double the capacitance C (i.e., 2 C). The capacitance of each of the capacitors C3$pp$, C3$pn$, C3$np$, and C3$nn$ is quadruple the capacitance C (i.e., 4 C). The capacitance of each of the capacitors C2$pp$, C2$pn$, C2$np$, and C2$nn$ is eight times the capacitance C (i.e., 8 C). The capacitance of each of the capacitors C1$pp$, C1$pn$, C1$np$, and C1$nn$ is 16 times the capacitance C (i.e., 16 C). The capacitance of each of the capacitors C0$pp$, C0$pn$, C0$np$, and C0$nn$ is 32 times the capacitance C (i.e., 32 C).

The plurality of switching elements Sp include 13 switching elements S0$pp$, S0$pn$, S1$pp$, S1$pn$, S2$pp$, S2$pn$, S3$pp$, S3$pn$, S4$pp$, S4$pn$, S5$pp$, S5$pn$, and S6$p$. The plurality of switching elements Sn include 13 switching elements S0$np$, S0$nn$, S1$np$, S1$nn$, S2$np$, S2$nn$, S3$np$, S3$nn$, S4$np$, S4$nn$, S5$np$, S5$nn$, and S6$n$. Each of the switching elements Sp and the switching elements Sn includes a first end, a second end, and a third end. Each of the switching elements Sp and the switching elements Sn is brought to either a state in which the first end and the second end are coupled, or a state in which the first end and the third end are coupled.

A voltage Vinp is supplied to a first end of the switching element 221p_j. A second end of the switching element 221p_j is coupled to a first end of each of the capacitors Cp in the CAP-CDAC 222_j and a first input end of the comparator 223_j. A voltage Vcmpp appears in an interconnect coupled to the second end of the switching element 221p_j, the first end of each of the capacitors Cp, and the first input end of the comparator 223_j.

A voltage Vinn is supplied to a first end of the switching element 221n_j. A second end of the switching element 221n_j is coupled to a first end of each of the capacitors Cn in the CAP-CDAC 222_j and a second input end of the comparator 223_j. A voltage Vcmpn appears in an interconnect coupled to the second end of the switching element 221n_j, the first end of each of the capacitors Cn, and the second input end of the comparator 223_j.

If the signal CK2_j is at the "H" level, the switching elements 221p_j and 221n_j are brought to an on state. If the signal CK2_j is at the "L" level, the switching elements 221p_j and 221n_j are brought to an off state.

With the above-described configuration, a charge corresponding to the voltage Vinp at a timing when the signal CK2_j is brought to the "H" level is stored into the first end of each of the capacitors Cp in the CAP-CDAC 222_j. Thereby, the voltage Vinp is stored in the CAP-CDAC 222_j as an initial voltage Vcmpp0 of the voltage Vcmpp. Similarly, a charge corresponding to the voltage Vinn at a timing when the signal CK2_j is brought to the "H" level is stored into the first end of each of the capacitors Cn in the CAP-CDAC 222_j. Thereby, the voltage Vinn is stored in the CAP-CDAC 222_j as an initial voltage Vcmpn0 of the voltage Vcmpn.

A second end of the capacitor C0pp is coupled to a first end of the switching element S0pp. A second end of the capacitor C0pn is coupled to a first end of the switching element S0pn. A second end of the capacitor C1pp is coupled to a first end of the switching element S1pp. A second end of the capacitor C1pn is coupled to a first end of the switching element S1pn. A second end of the capacitor C2pp is coupled to a first end of the switching element S2pp. A second end of the capacitor C2pn is coupled to a first end of the switching element S2pn. A second end of the capacitor C3pp is coupled to a first end of the switching element S3pp. A second end of the capacitor C3pn is coupled to a first end of the switching element S3pn. A second end of the capacitor C4pp is coupled to a first end of the switching element S4pp. A second end of the capacitor C4pn is coupled to a first end of the switching element S4pn. A second end of the capacitor C5pp is coupled to a first end of the switching element S5pp. A second end of the capacitor C5pn is coupled to a first end of the switching element S5pn. A second end of the capacitor C6p is coupled to a first end of the switching element S6p. A reference voltage VRn_j is supplied to a second end of the capacitor C7p. A reference voltage VRp_j is supplied to a second end of each of the switching elements Sp. The reference voltage VRn_j is supplied to a third end of each of the switching elements Sp.

A second end of the capacitor C0np is coupled to a first end of the switching element S0np. A second end of the capacitor C0nn is coupled to a first end of the switching element S0nn. A second end of the capacitor C1np is coupled to a first end of the switching element S1np. A second end of the capacitor C1nn is coupled to a first end of the switching element S1nn. A second end of the capacitor C2np is coupled to a first end of the switching element S2np. A second end of the capacitor C2nn is coupled to a first end of the switching element S2nn. A second end of the capacitor C3np is coupled to a first end of the switching element S3np. A second end of the capacitor C3nn is coupled to a first end of the switching element S3nn. A second end of the capacitor C4np is coupled to a first end of the switching element S4np. A second end of the capacitor C4nn is coupled to a first end of the switching element S4nn. A second end of the capacitor C5np is coupled to a first end of the switching element S5np. A second end of the capacitor C5nn is coupled to a first end of the switching element S5nn. A second end of the capacitor C6n is coupled to a first end of the switching element S6n. The reference voltage VRp_j is supplied to a second end of the capacitor C7n. The reference voltage VRn_j is supplied to a second end of each of the switching elements Sn. The reference voltage VRp_j is supplied to a third end of each of the switching elements Sn.

The comparator 223_j includes the first input end to which the voltage Vcmpp is supplied, the second input end to which the voltage Vcmpn is supplied, a first output end coupled to a first input end of the NOR 224_j and the control circuit 225_j, and a second output end coupled to a second input end of the NOR 224_j and the control circuit 225_j. The comparator 223_j receives a signal CCK from the control circuit 225_j.

Based on an "L"-level signal CCK, the comparator 223_j resets the first output end and the second output end of the comparator 223_j, and outputs "L"-level signals Qp and Qn. Based on an "H"-level signal CCK, the comparator 223_j performs a comparison process of comparing the magnitude relationship between the voltages Vcmpp and Vcmpn.

The comparison process is performed as below. If a difference between the voltage Vcmpp and the voltage Vcmpn (hereinafter referred to as a "potential difference (Vcmpp-Vcmpn)") is positive, the comparator 223_j outputs an "H"-level signal Qp from the first output end, and outputs an "L"-level signal Qn from the second output end. If the potential difference (Vcmpp-Vcmpn) is negative, the comparator 223_j outputs an "L"-level signal Qp from the first output end, and outputs an "H"-level signal Qn from the second output end. If the potential difference (Vcmpp-Vcmpn) is assumed to be 0, the comparator 223_j outputs an "L"-level signal Qp from the first output end, and outputs an "L"-level signal Qn from the second output end.

The NOR 224_j notifies the control circuit 225_j that the comparison process by the comparator 223_j has come to an end. Specifically, if both the signal Qp input from the first input end of the comparator 223_j and the signal Qn input from the second input end of the comparator 223_j are at the "L" level, the NOR 224_j outputs an "H"-level signal RY to the control circuit 225_j. If either the signal Qp input from the first input end of the comparator 223_j or the signal Qn input from the second input end of the comparator 223_j is at the "H" level, the NOR 224_j outputs an "L"-level signal RY to the control circuit 225_j.

Based on an "H"-level signal CK2_j, the control circuit 225_j outputs an "L"-level signal CCK. Based on an "L"-level signal CK2_j, the control circuit 225_j performs a determination process of sequentially determining bits of a bit string X0_j<0:7>, from a most significant bit to a least significant bit.

The determination process is performed as below. If the signal RY is at the "H" level, the control circuit 225_j outputs an "H"-level signal CCK, and causes the comparator 223_j to execute a comparison process of a bit (e.g., a most significant bit). As a result of the comparison process, the signal Qp or Qn is brought to the "H" level, and the signal RY is brought to the "L" level. If the signal RY is at the "L" level, the control circuit 225_j performs determination of the bit based on the signals Qp and Qn, outputs an "L"-level signal CCK, and causes the comparator 223_j to reset the first output end and the second output end. As a result of the resetting, the signals Qp and Qn are brought to the "L" level, and the signal RY is brought to the "H" level. If the signal RY is at the "H" level, the control circuit 225_j outputs an "H"-level signal CCK, and causes the comparator 223_j to execute a comparison process of a subsequent bit (e.g., a second most significant bit). In this manner, bit-by-bit comparison and determination are sequentially repeated by toggling between the signals CCK and RY so as to invert one another.

A specific determination process of each bit is performed as below. If the signals Qp and Qn are at "H" level and "L" level, respectively (if the potential difference Vcmpp-Vcmpn is positive), the control circuit 225_j determines that the corresponding bit is "1". If the signals Qp and Qn are at "L" level and "H" level, respectively (if the potential difference Vcmpp-Vcmpn is negative), the control circuit 225_j determines that the corresponding bit is "0". If both of the signals Qp and Qn are at "L" level (if the potential difference Vcmpp-Vcmpn is 0), the control circuit 225_j determines that the corresponding bit and all the subsequent bits are "0".

The control circuit 225_j generates a signal CNT every time a bit is determined, and outputs the signal CNT to the CAP drivers 226p_j and 226n_j. If, for example, the determined bit is "1", the control circuit 225_j generates an "H"-level signal CNT. If the determined bit is "0", the control circuit 225_j generates an "L"-level signal CNT.

The CAP driver 226p_j switches the states of the switching elements Sp based on a signal CNT. Specifically, if a signal CNT corresponding to a bit X0_j<z> is at the "H" level, the CAP driver 226p_j switches a switching element Szpp included in the switching elements Sp from a state in which a first end and a second end are coupled to a state in which the first end and a third end are coupled ($0 \leq z \leq 5$). If the signal CNT corresponding to the bit X0_j<z> is at the "L" level, the CAP driver 226p_j switches a switching element Szpn included in the switching elements Sp from a state in which a first end and a third end are coupled to a state in which the first end and a second end are coupled. Similarly, if a signal CNT corresponding to a bit X0_j<6> is at the "H" level, the CAP driver 226p_j switches a switching element S6p included in the switching elements Sp from a state in which a first end and a second end are coupled to a state in which the first end and a third end are coupled. If the signal CNT corresponding to the bit X0_j<6> is at the "L" level, the CAP driver 226p_j maintains the switching element S6p at the state in which the first end and the second end are coupled.

The CAP driver 226n_j switches the states of the switching elements Sn based on the signal CNT. Specifically, if a signal CNT corresponding to a bit X0_j<z> is at the "H" level, the CAP driver 226n_j switches a switching element Sznp included in the switching elements Sn from a state in which a first end and a second end are coupled to a state in which the first end and a third end are coupled ($0 \leq z \leq 5$). If the signal CNT corresponding to the bit X0_j<z> is at the "L" level, the CAP driver 226n_j switches a switching element Sznn included in the switching elements Sn from a state in which a first end and a third end are coupled to a state in which the first end and a second end are coupled. Similarly, if a signal CNT corresponding to a bit X0_j<6> is at the "H" level, the CAP driver 226n_j maintains a switching element S6n included in the switching elements Sn in the state in which a first end and a second end are coupled. If the signal CNT corresponding to the bit X0_j<6> is at the "L" level, the CAP driver 226n_j switches the switching element S6n from the state in which the first end and the second end are coupled to a state in which the first end and a third end are coupled.

1.5 Reference Voltage Generator

Next, an internal configuration of the reference voltage generator (VREFGEN) in the receiver circuitry according to the embodiment will be described. FIG. 5 is a block diagram showing an example of a configuration of the reference voltage generator of the receiver circuitry according to the embodiment. The VREFGEN 30 includes a P-side 30p and an N-side 30n. The P-side 30p and the N-side 30n correspond to circuit portions that generate reference voltages VRp and VRn, respectively.

The P-side 30p includes VREF driver sets 31p, 32p, 33p, and 34p. The VREF driver set 31p is configured to supply reference voltages VRp_0, VRp_4, VRp_8, VRp_12, VRp_16, VRp_20, VRp_24, and VRp_28 to the SAR-ADCs 22_0, 22_4, 22_8, 22_12, 22_16, 22_20, 22_24, and 22_28, respectively. The VREF driver set 32p is configured to supply reference voltages VRp_1, VRp_5, VRp_9, VRp_13, VRp_17, VRp_21, VRp_25, and VRp_29 to the SAR-ADCs 22_1, 22_5, 22_9, 22_13, 22_17, 22_21, 22_25, and 22_29, respectively. The VREF driver set 33p is configured to supply reference voltages VRp_2, VRp_6, VRp_10, VRp_14, VRp_18, VRp_22, VRp_26, and VRp_30 to the SAR-ADCs 22_2, 22_6, 22_10, 22_14, 22_18, 22_22, 22_26, and 22_30, respectively. The VREF driver set 34p is configured to supply reference voltages VRp_3, VRp_7, VRp_11, VRp_15, VRp_19, VRp_23, VRp_27, and VRp_31 to the SAR-ADCs 22_3, 22_7, 22_11, 22_15, 22_19, 22_23, 22_27, and 22_31, respectively.

The N-side 30n includes VREF driver sets 31n, 32n, 33n, and 34n. The VREF driver set 31n is configured to supply reference voltages VRn_0, VRn_4, VRn_8, VRn_12, VRn_16, VRn_20, VRn_24, and VRn_28 to the SAR-ADCs 22_0, 22_4, 22_8, 22_12, 22_16, 22_20, 22_24, and 22_28, respectively. The VREF driver set 32n is configured to supply reference voltages VRn_1, VRn_5, VRn_9, VRn_13, VRn_17, VRn_21, VRn_25, and VRn_29 to the SAR-ADCs 22_1, 22_5, 22_9, 22_13, 22_17, 22_21, 22_25, and 22_29, respectively. The VREF driver set 33n is configured to supply reference voltages VRn_2, VRn_6, VRn_10, VRn_14, VRn_18, VRn_22, VRn_26, and VRn_30 to the SAR-ADCs 22_2, 22_6, 22_10, 22_14, 22_18, 22_22, 22_26, and 22_30, respectively. The VREF driver set 34n is configured to supply reference voltages VRn_3, VRn_7, VRn_11, VRn_15, VRn_19, VRn_23, VRn_27, and VRn_31 to the SAR-ADCs 22_3, 22_7, 22_11, 22_15, 22_19, 22_23, 22_27, and 22_31, respectively.

The VREF driver sets 31p, 32p, 33p, and 34p have configurations equivalent to one another, except for a difference in a destination to which the reference voltage VRp is output. The VREF driver sets 31n, 32n, 33n, and 34n have configurations equivalent to those of the VREF driver sets 31p, 32p, 33p, and 34p, respectively, except that a reference voltage VRn is output in place of the reference voltage VRp. Hereinafter, a configuration of the VREF driver set 31p will be described as an example.

FIG. 6 is a block diagram showing an example of a configuration of a VREF driver set of the reference voltage generator according to the embodiment. The VREF driver set 31p includes a plurality of buffers 311p, a plurality of capacitors 312p, a plurality of switching elements 313p, a buffer 314p, and a capacitor 315p. The plurality of buffers 311p include eight buffers 311p_0, 311p_4, 311p_8, 311p_12, 311p_16, 311p_20, 311p_24, and 311p_28. The plurality of capacitors 312p include eight capacitors 312p_0, 312p_4, 312p_8, 312p_12, 312p_16, 312p_20, 312p_24, and 312p_28. The plurality of switching elements 313p include eight switching elements 313p_0, 313p_4, 313p_8, 313p_12, 313p_16, 313p_20, 313p_24, and 313p_28.

A reference voltage VRpREF is supplied to an input end of each of the buffers 311p and an input end of the buffer 314p. The reference voltage VRpREF is a reference voltage based on which the reference voltages VRp_0 to VRp_31 are supplied. The reference voltage VRpREF corresponds to the reference voltages VRp_0 to VRp_31.

An output end of the buffer 311p_0 is coupled to a first end of the capacitor 312p_0, a first end of the switching element 313p_0, and the SAR-ADC 22_0. An output end of the buffer 311p_4 is coupled to a first end of the capacitor 312p_4, a first end of the switching element 313p_4, and the SAR-ADC 22_4. An output end of the buffer 311p_8 is coupled to a first end of the capacitor 312p_8, a first end of the switching element 313p_8, and the SAR-ADC 22_8. An output end of the buffer 311p_12 is coupled to a first end of the capacitor 312p_12, a first end of the switching element 313p_12, and the SAR-ADC 22_12. An output end of the buffer 311p_16 is coupled to a first end of the capacitor 312p_16, a first end of the switching element 313p_16, and the SAR-ADC 22_16. An output end of the buffer 311p_20 is coupled to a first end of the capacitor 312p_20, a first end of the switching element 313p_20, and the SAR-ADC 22_20. An output end of the buffer 311p_24 is coupled to a first end of the capacitor 312p_24, a first end of the switching element 313p_24, and the SAR-ADC 22_24. An output end of the buffer 311p_28 is coupled to a first end of the capacitor 312p_28, a first end of the switching element 313p_28, and the SAR-ADC 22_28. A second end of each of the capacitors 312p_0, 312p_4, 312p_8, 312p_12, 312p_16, 312p_20, 312p_24, and 312p_28 is grounded.

An output end of the buffer 314p is coupled to a first end of the capacitor 315p, and to a second end of each of the switching elements 313p_0, 313p_4, 313p_8, 313p_12, 313p_16, 313p_20, 313p_24, and 313p_28. A second end of the capacitor 315p is grounded.

The switching elements 313p_0, 313p_4, 313p_8, 313p_12, 313p_16, 313p_20, 313p_24, and 313p_28 are brought to an on state if corresponding signals CK2_4, CK2_8, CK2_12, CK2_16, CK2_20, CK2_24, CK2_28, and CK2_0 are at the "H" level, and are brought to an off state if the corresponding signals are at the "L" level.

With the above-described configuration, the VREF driver set 31p is capable of independently outputting the reference voltages VRp_0, VRp_4, VRp_8, VRp_12, VRp_16, VRp_20, VRp_24, and VRp_28 to the SAR-ADCs 22_0, 22_4, 22_8, 22_12, 22_16, 22_20, 22_24, and 22_28, respectively.

2. Operation

Figure 7:
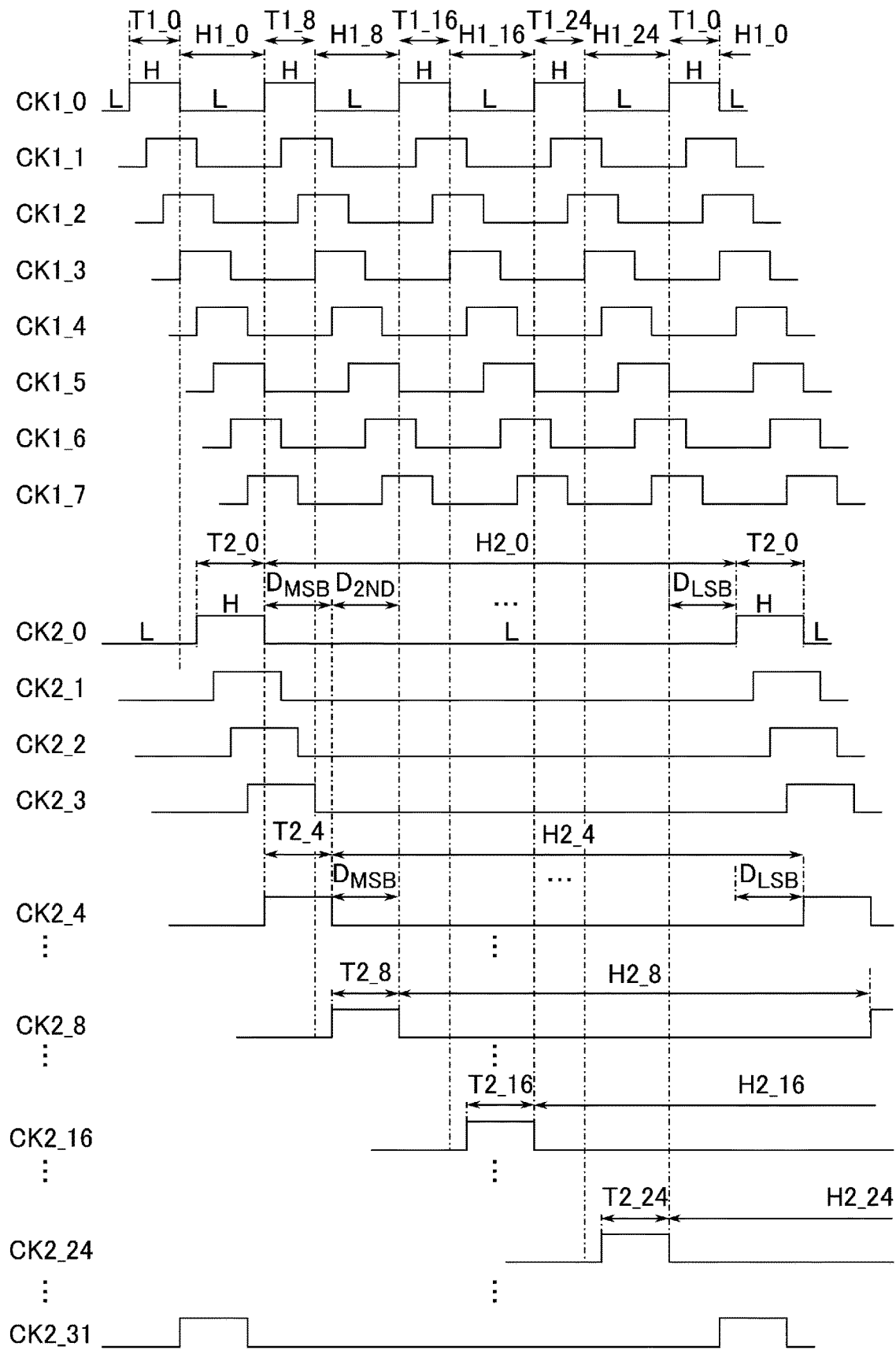
FIG. 7 is a timing chart showing an example of clock signals in the receiver device according to the embodiment.

Next, an operation of the receiver device according to the embodiment will be described.
2.1 Clock Timing
A description will be given of clock timing in the receiver device according to the embodiment. FIG. 7 is a timing chart showing an example of clock signals in the receiver device according to the embodiment.

A signal CK1 includes 8-phase clock signals shifting in phase at equal intervals. The "H"-level periods of the signal CK1 are equal (T1). The "L"-level periods of the signal CK1 are equal (H1).

The signal CK2 includes 32-phase clock signals shifting in phase at equal intervals. The "H"-level periods of the signal CK2 are equal (T2). The "L"-level periods of the signal CK2 are equal (H2).

An $n_{r2}/n_{r1}$ cycle of the signal CK1 is, for example, equal to a single cycle of the signal CK2. That is, if $n_{r1}$=8, and $n_{r2}$=32, 4(T1+H1)=T2+H2 is satisfied. The period H1 is, for example, longer than the period T2.

Hereinafter, a relationship between the signal CK1_0 and the signal CK2 will be described.

While the first-cycle signal CK1 is at the "H" level (period T1_0 in FIG. 7), the switching element 212_0 of each of the SFEs 21p and 21n is brought to an on state. Thereby, a charge corresponding to each of the signals Sin and /Sin is stored into the capacitor 213_0 of each of the SFEs 21p and 21n. While the first-cycle signal CK1 is at the "L" level (period H1_0 in FIG. 7), the switching element 212_0 of each of the SFEs 21p and 21n is brought to an off state. During the period H1_0, the buffer 214_0 stores the charge stored into the capacitor 213_0.

The period H1_0 includes a period during which the signal CK2_0 is brought to the "H" level (period T2_0 in FIG. 7). During the period T2_0, the switching elements 221p_0 and 221n_0 of the SAR-ADC 22_0 are brought to an on state. Thereby, the charge stored in the buffer 214_0 of each of the SFEs 21p and 21n is stored into each of the capacitors Cp and Cn in the CAP-CDAC 222_0. Thereafter, during the period in which the signal CK2_0 is brought to the "L" level (period H2_0 in FIG. 7), the switching elements 221p_0 and 221n_0 of the SAR-ADC 22_0 are brought to an off state. During the period H2_0, the CAP-CDAC 222_0 stores the charge stored in the capacitors Cp and Cn. The stored charge is conserved over the period H2_0. Bits of a bit string X0_0<0:7> included in data X0_0 are sequentially determined, from a most significant bit to a least significant bit, using the stored charge.

In FIG. 7, a period during which the most significant bit is determined, a period during which the second most significant bit is determined, . . . , and a period during which the least significant bit is determined are respectively denoted as periods "$D_{MSB}$", "$D_{2ND}$", . . . , and "$D_{LSB}$". In the example of FIG. 7, the period $D_{MSB}$ of the signal CK2_0 is included in the period during which the signal CK2_4 is brought to the "H" level (period T2_4 in FIG. 7). The period $D_{2ND}$ of the signal CK2_0 is included in the period during which the signal CK2_8 is at the "H" level (period T2_8 in FIG. 7). The period $D_{MSB}$ of the signal CK2_4 is included in the period during which the signal CK2_8 is at the "H" level (period T2_8 in FIG. 7). It is to be noted that each of the periods $D_{MSB}$, $D_{2ND}$, . . . , and $D_{LSB}$ may extend over a period during which a plurality of clock signals of the signal CK2 are at the "H" level.

The second-cycle, third-cycle, and fourth-cycle operations are equivalent to the first-cycle operation. That is, while the second-cycle, third-cycle, and fourth-cycle signals CK1 are at the "H" level (periods T1_8, T1_16, and T1_24 in FIG. 7), the switching element 212_0 of each of the SFEs 21p and 21n is brought to an on state. Thereby, a charge corresponding to each of the signals Sin and /Sin is stored into the capacitor 213_0 of each of the SFEs 21p and 21n. While the second-cycle, third-cycle, and fourth-cycle signals CK1 are at the "L" level (periods H1_8, H1_16, and H1_24 in FIG. 7), the switching element 212_0 of each of the SFEs 21p and 21n is brought to an off state. While the switching element 212_0 is at an off state, the buffer 214_0 stores the value of the voltage charged into the capacitor 213_0.

The periods H1_8, H1_16, and H1_24 respectively include a period during which the signals CK2_8, CK2_16, and CK2_24 are at the "H" level (periods T2_8, T2_16, and T2_24 in FIG. 7). During the periods T2_8, T2_16, and T2_24, the switching elements 221p_8 and 221n_8 of the SAR-ADC 22_8, the switching elements 221p_16 and 221n_16 of the SAR-ADC 22_16, and the switching elements 221p_24 and 221n_24 of the SAR-ADC 22_24 are brought to an on state. Thereby, the charge stored in the buffer 214_0 of each of the SFEs 21p and 21n is stored into the capacitors Cp and Cn of the CAP-CDAC 222_8 during the period T2_8, stored into the capacitors Cp and Cn of the CAP-CDAC 222_16 during the period T2_16, and stored into the capacitors Cp and Cn of the CAP-CDAC 222_24 during the period T2_24. Thereafter, during the period in which the signals CK2_8, CK2_16, and CK2_24 are brought to the "L" level (periods H2_8, H2_16, and H2_24 in FIG. 7), the switching elements 221p_8 and 221n_8 of the SAR-ADC 22_8, the switching elements 221p_16 and 221n_16 of the SAR-ADC 22_16, and the switching elements 221p_24 and 221n_24 of the SAR-ADC 22_24 are brought to an off state. During the periods H2_8, H2_16, and H2_24, the CAP-CDACs 222_8, 222_16, and 222_24 respectively store the charge stored into the capacitors Cp and Cn. The stored charge is conserved over the periods H2_8, H2_16, and H2_24. Bits of bit strings X0_8<0:7>, X0_16<0:7>, and X0_24<0:7> are sequentially determined, from a most significant bit to a least significant bit, using the charge stored during the respective periods H2_8, H2_16, and H2_24.

2.2 Determination Process

Figure 8:
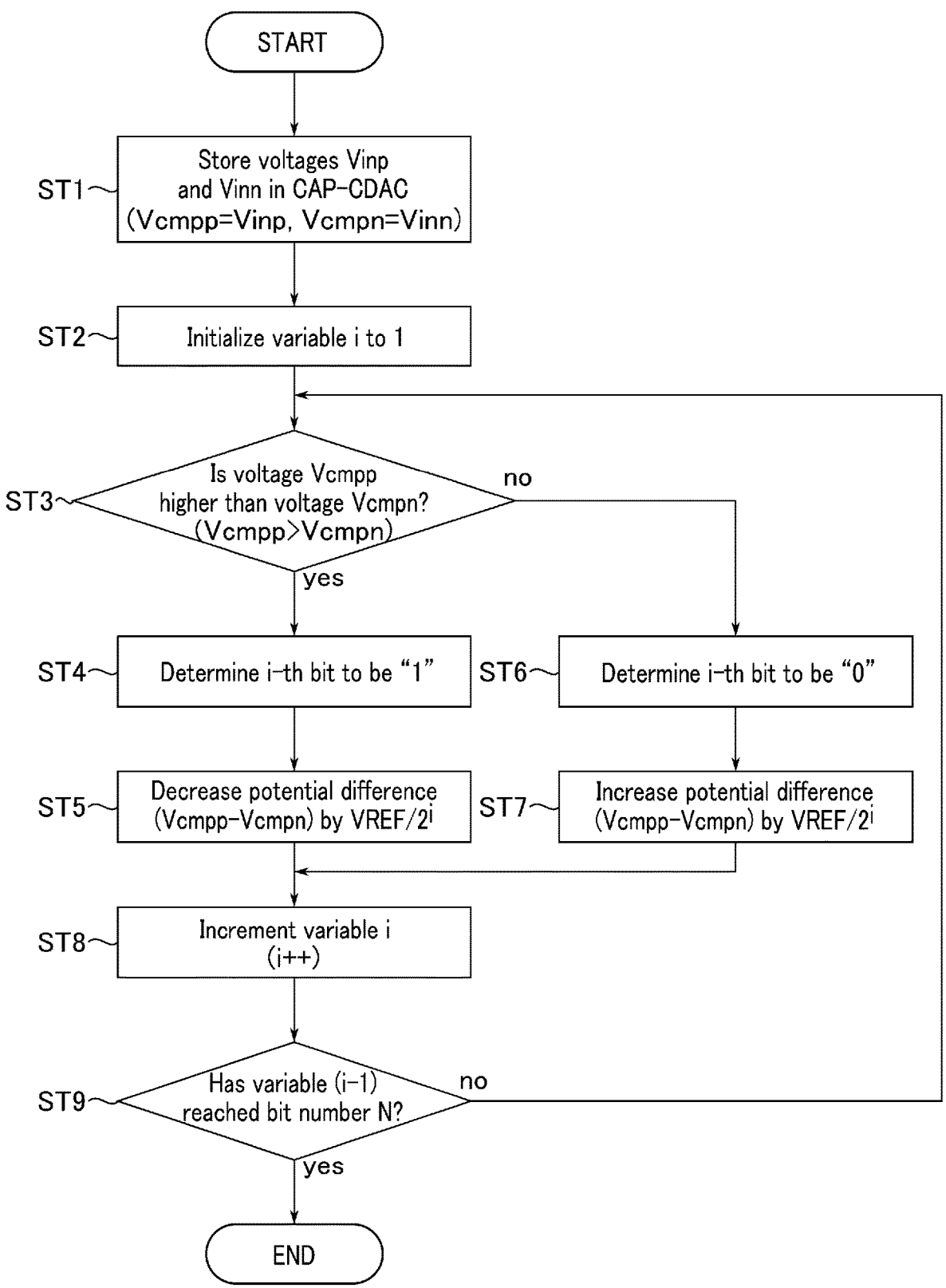
FIG. 8 is a flowchart showing an example of a determination process in the receiver device according to the embodiment.

Next, a bit string determination process in the receiver device according to the embodiment will be described. FIG. 8 is a flowchart showing an example of a bit string determination process in the receiver device according to the embodiment.

If the signal CK2_j is brought to the "H" level (START), the switching elements 221p_j and 221n_j of the SAR-ADC 22_j are brought to an on state. Thereafter, the signal CK2_j is brought to the "L" level, and the switching elements 221p_j and 221n_j of the SAR-ADC 22_j are brought to an off state. In accordance therewith, voltages Vinp and Vinn are stored in a CAP-CDAC 222_j (ST1). Specifically, a charge corresponding to the voltage Vinp is stored into a plurality of capacitors Cp, and thereby the voltage Vinp is stored as an initial value Vcmpp0 of the voltage Vcmpp. With the charge corresponding to the voltage Vinn being stored into the plurality of capacitors Cn, the voltage Vinn is stored as an initial value Vcmpn0 of the voltage Vcmpn.

The control circuit 225_j initializes a variable i to 1 (ST2). The variable i is an integer equal to or greater than 1 and equal to or less than N. N represents the number of bits (e.g., 8) of data included in the signal X0.

The comparator 223_j determines whether or not the voltage Vcmpp is higher than the voltage Vcmpn (ST3).

If the voltage Vcmpp is higher than the voltage Vcmpn (ST3; yes), the comparator 223_j outputs a "1" signal Qp and a "0" signal Qn to the control circuit 225_j. The control circuit 225_j determines, based on the "1" signal Qp and the "0" signal Qn, that an i-th bit is "1" (ST4). The control circuit 225_j generates a signal CNT based on the determination result, and outputs it to the CAP drivers 226p_j and 226n_j.

The CAP drivers 226p_j and 226n_j decrease a potential difference (Vcmpp-Vcmpn) by VREF/$2^i$ by switching the switching elements Sp and Sn based on the signal CNT (ST5).

If the voltage Vcmpp is lower than the voltage Vcmpn (ST3; no), the comparator 223_j outputs a "0" signal Qp and a "1" signal Qn to the control circuit 225_j. The control circuit 225_j determines, based on the "0" signal Qp and the "1" signal Qn, that the i-th bit is "0" (ST6). The control circuit 225_j generates a signal CNT based on the determination result, and outputs it to the CAP drivers 226p_j and 226n_j.

The CAP drivers 226p_j and 226n_j increase the potential difference (Vcmpp-Vcmpn) by VREF/$2^i$ by switching the switching elements Sp and Sn based on the signal CNT (ST7).

After the process at ST5 or ST7, the control circuit 225_j increments the variable i (ST8).

The control circuit 225_j determines whether or not the variable i−1 has reached a bit number N (ST9).

If the variable i−1 is less than the bit number N (ST9; no), the comparator 223_j determines whether or not the voltage Vcmpp is higher than the voltage Vcmpn (ST3). Thereafter, the subsequent process from ST4 to ST9 is executed. In this manner, the process from ST3 to ST9 is repeated until the variable i−1 reaches the bit number N.

If the variable i−1 reaches the bit number N (ST9; yes), the determination process comes to an end (END).

2.3 Potential Difference Changing Process

Next, a potential difference changing process in the receiver device according to the embodiment will be described. The potential difference changing process is a process of increasing or decreasing a potential difference (Vcmpp-Vcmpn) based on the bit determined in the determination process. That is, the potential difference changing process corresponds to the process at ST5 and the process at ST7 in FIG. 8. The potential difference changing process is executed during the period in which an immediately preceding determination process is executed. Specifically, for example, a potential difference changing process after a most-significant-bit determination process is executed in the period $D_{MSB}$. A potential difference changing process after a second-most-significant-bit determination process is executed in the period $D_{2ND}$.

2.3.1 Initialization

It is assumed that, at the start of a determination process, the CAP-CDAC 222_j has been initialized. Specifically, the control circuit 225_j brings each of the switching elements S0pp, S0np, S1pp, S1np, S2pp, S2np, S3pp, S3np, S4pp, S4np, S5pp, S5np, S6p, and S6n of the CAP-CDACs 222_j to a state in which the first end and the second end are coupled. The control circuit 225_j brings each of the switching elements S0pn, S0nn, S1pn, S1nn, S2pn, S2nn, S3pn, S3nn, S4pn, S4nn, S5pn, and S5nn of the CAP-CDAC 222_j to a state in which the first end and the third end are coupled.

Thereby, assuming that an initial value of the voltage Vcmpp is Vcmpp0, a charge Xp0 stored in the capacitors Cp at the start of the determination process can be expressed as in the following formula (0-1).

$$Xp0 = 64C\ (Vcmpp0 - VRp) + 64C\ (Vcmpp0 - VRn) = \quad (0\text{-}1)$$
$$128CVcmpp0 - 64CVRp - 64CVRn$$

Similarly, assuming that an initial value of the voltage Vcmpn is Vcmpn0, a charge Xn0 stored in the capacitors Cn at the start of the determination process can be expressed as in the following formula (0-2).

$$Xn0 = 64C\ (Vcmpn0 - VRp) + 64C\ (Vcmpn0 - VRn) = \quad (0\text{-}2)$$
$$128CVcmpn0 - 64CVRp - 64CVRn$$

Based on the formulae (0-1) and (0-2), a difference (Xp0–Xn0) between the charges Xp0 and Xn0 can be expressed as in the following formula (0-3). The difference (Xp0–Xn0) between the charges Xp0 and Xn0 is conserved over the determination process.

$$Xp0\text{-}Xn0 = 128\ C(Vcmpp0\text{-}Vcmpn0) \quad (0\text{-}3)$$

2.3.2 Potential Difference Changing Process after Most-Significant-Bit Determination FIG. 9 is a diagram showing an example of a potential difference changing process based on a most significant bit determined by a determination process in the receiver device according to the embodiment. In the example of FIG. 9, switching the switching elements Sp and Sn in a case where the most significant bit is determined to be "1" is shown.

As shown in FIG. 9, if the most significant bit is determined to be "1", the CAP drivers 226p_j and 226n_j respectively switch the switching elements S0pp and S0np from a state in which the first end and the second end are coupled to a state in which the first end and the third end are coupled. Thereby, assuming that the voltage Vcmpp after the switching of the switching element S0pp is Vcmpp1, a charge Xp1 stored in the capacitors Cp after the switching of the switching element S0pp can be expressed as in the following formula (1-1).

$$Xp1 = 32C\ (Vcmpp1 - VRp) + 96C\ (Vcmpp1 - VRn) = \quad (1\text{-}1)$$
$$128CVcmpp1 - 32CVRp - 96CVRn$$

Similarly, assuming that the voltage Vcmpn after the switching of the switching element S0np is Vcmpn1, a charge Xn1 stored in the capacitors Cn after the switching of the switching element S0np can be expressed as in the following formula (1-2).

$$Xn1 = 96C\ (Vcmpn1 - VRp) + 32C\ (Vcmpn1 - VRn) = \quad (1\text{-}2)$$
$$128CVcmpn1 - 96CVRp - 32CVRn$$

Based on the formulae (1-1) and (1-2), a difference (Xp1–Xn1) between the charges Xp1 and Xn1 can be expressed as in the following formula (1-3).

$$Xp1\text{-}Xn1 = 128\ C(Vcmpp1\text{-}Vcmpn1) + 64\ C(VRp\text{-}VRn) \quad (1\text{-}3)$$

As described above, the difference (Xp1–Xn1) between the charges Xp1 and Xn1 is conserved over the determination process, and is therefore equal to the difference (Xp0–Xn0). Accordingly, based on the formulae (0-3) and (1-3), the potential difference (Vcmpp1–Vcmpn1) is decreased by VREF/2 from the potential difference (Vcmpp0–Vcmpn0), as in the following formula (1-4).

$$Vcmpp1 - Vcmpn1 = Vcmpp0 - Vcmpn0 - (VRp - VRn)/2 = \quad (1\text{-}4)$$
$$Vcmpp0 - Vcmpn0 - VREF/2$$

Figure 10:
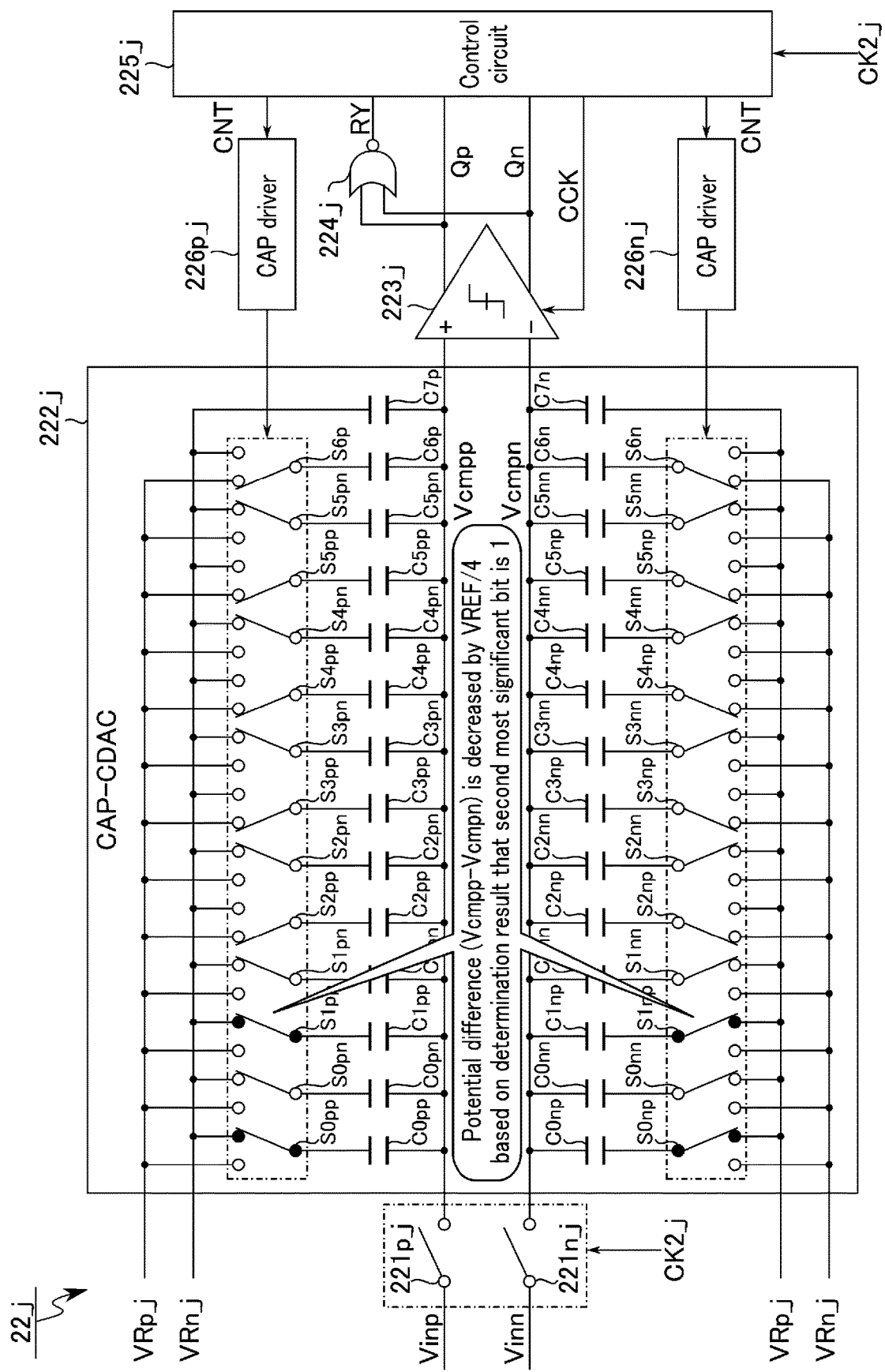
FIG. 10 is a diagram showing an example of a potential difference changing process based on a second most significant bit determined by the determination process in the receiver device according to the embodiment.

2.3.3 Potential Difference Changing Process after Second-Most-Significant-Bit Determination FIG. 10 is a diagram showing an example of a potential difference changing process based on a second most significant bit determined by a determination process in the receiver device according to the embodiment. In the example of FIG. 10, switching the switching elements Sp and Sn in a case where the most significant bit is determined to be "1" and then the second most significant bit is determined to be "1" is shown.

As shown in FIG. 10, if the second most significant bit is determined to be "1", the CAP drivers 226p_j and 226n_j respectively switch the switching elements S1pp and S1np from a state in which the first end and the second end are coupled to a state in which the first end and the third end are coupled. Thereby, assuming that the voltage Vcmpp after the switching of the switching element S1pp is Vcmpp2, a charge Xp2 stored in the capacitors Cp after the switching of the switching element S1pp can be expressed as in the following formula (2-1).

$$Xp2 = 16C\ (Vcmpp2 - VRp) + 112C\ (Vcmpp2 - VRn) = \quad (2\text{-}1)$$
$$128CVcmpp2 - 16CVRp - 112CVRn$$

Similarly, assuming that the voltage Vcmpn after the switching of the switching element S1np is Vcmpp2, a charge Xn2 stored in the capacitors Cn after the switching of the switching element S1np can be expressed as in the following formula (2-2).

$$Xn2 = 112C\ (Vcmpn2 - VRp) + 16C\ (Vcmpn2 - VRn) = \quad (2\text{-}2)$$
$$128CVcmpn2 - 112CVRp - 16CVRn$$

Based on the formulae (2-1) and (2-2), a difference (Xp2–Xn2) between the charges Xp2 and Xn2 can be expressed as in the following formula (2-3).

$$Xp2\text{-}Xn2 = 128\ C(Vcmpp2\text{-}Vcmpn2) + 96\ C(VRp\text{-}VRn) \quad (2\text{-}3)$$

As described above, the difference (Xp2–Xn2) between the charges Xp2 and Xn2 is conserved over the determination process, and is therefore equal to the difference (Xp1–Xn1). Accordingly, based on the formulae (1-3) and (2-3), the potential difference (Vcmpp2–Vcmpp2) is decreased by VREF/4 from the potential difference (Vcmpp1–Vcmpn1), as in the following formula (2-4).

$$Vcmpp2 - Vcmpn2 = Vcmpp1 - Vcmpn1 - (VRp - VRn)/4 = \quad (2\text{-}4)$$
$$Vcmpp1 - Vcmpn1 - VREF/4$$

Figure 11:
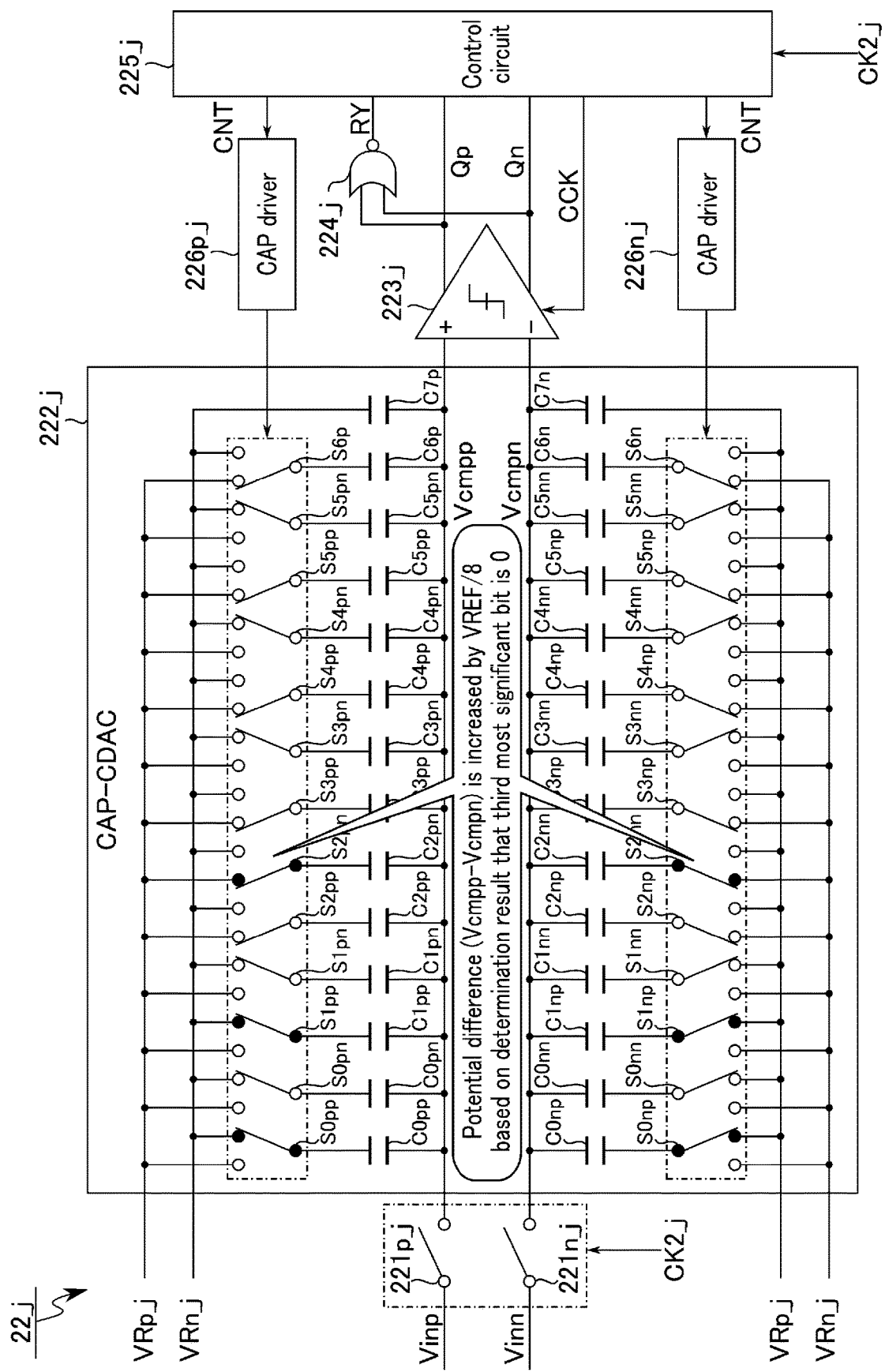
FIG. 11 is a diagram showing an example of a potential difference changing process based on a third most significant bit determined by the determination process in the receiver device according to the embodiment.

2.3.4 Potential Difference Changing Process after Third-Most-Significant-Bit Determination FIG. 11 is a diagram showing an example of a potential difference changing process based on a third most significant bit determined by a determination process in the receiver device according to the embodiment. In the example of FIG. 11, switching between switching elements Sp and Sn in a case where the most significant bit and the second most significant bit are determined to be "1" and then the third most significant bit is determined to be "0" is shown.

As shown in FIG. 11, if the third most significant bit is determined to be "0", the CAP drivers 226$p\_j$ and 226$n\_j$ respectively switch the switching elements S2$pn$ and S2$nn$ from a state in which the first end and the third end are coupled to a state in which the first end and the second end are coupled. Thereby, assuming that the voltage Vcmpp after the switching of the switching element S2$pn$ is Vcmpp3, a charge Xp3 stored in the capacitors Cp after the switching of the switching element S2$pn$ can be expressed as in the following formula (3-1).

$$Xp3 = 24C\ (Vcmpp3 - VRp) + 104C\ (Vcmpp3 - VRn) = \quad (3\text{-}1)$$
$$128CVcmpp3 - 24CVRp - 104CVRn$$

Similarly, assuming that the voltage Vcmpn after the switching of the switching element S2$nn$ is Vcmpn3, a charge Xn3 stored in the capacitors Cn after the switching of the switching element S2$nn$ can be expressed as in the following formula (3-2).

$$Xp3 = 104C\ (Vcmpn3 - VRp) + 24C\ (Vcmpn3 - VRn) = \quad (3\text{-}2)$$
$$128CVcmpn3 - 104CVRp - 24CVRn$$

Based on the formulae (3-1) and (3-2), a difference (Xp3−Xn3) between the charges Xp3 and Xn3 can be expressed as in the following formula (3-3).

$$Xp3\text{-}Xn3 = 128\ C(Vcmpp3 - Vcmpn3) + 80\ C(VRp - VRn) \quad (3\text{-}3)$$

As described above, the difference (Xp3−Xn3) between the charges Xp3 and Xn3 is conserved over the determination process, and is therefore equal to the difference (Xp2−Xn2). Accordingly, based on the formulae (2-3) and (3-3), the potential difference (Vcmpp3−Vcmpn3) is increased by VREF/8 from the potential difference (Vcmpp2−Vcmpn2), as in the following formula (3-4).

$$Vcmpp3 - Vcmpn3 = Vcmpp2 - Vcmpn2 + (VRp - VRn)/8 = \quad (3\text{-}4)$$
$$Vcmpp2 - Vcmpn2 + VREF/8$$

2.3.5 Change in Potential Difference (Vcmpp-Vcmpn)

FIG. 12 is a timing chart showing an example of a transition of a potential difference to be a determination target in the determination process by the receiver device according to the embodiment. FIG. 12 shows an example of a transition of a potential difference (Vcmpp-Vcmpn) in a determination process, with the horizontal axis representing time and the vertical axis representing a potential difference (Vcmpp-Vcmpn). In FIG. 12, a period during which the potential difference (Vcmpp-Vcmpn) decreases by VREF/2, a period during which the potential difference (Vcmpp-Vcmpn) decreases by VREF/4, and a period during which the potential difference (Vcmpp-Vcmpn) increases by VREF/8 respectively correspond to FIG. 9, FIG. 10, and FIG. 11.

As described above, every time an i-th bit is determined to be "1", the CAP drivers 226$p\_j$ and 226$n\_j$ switch the switching elements Sp and Sn to decrease the potential difference (Vcmpp(i+1)−Vcmpn(i+1)) by $VREF/2^i$ relative to the potential difference (Vcmpp(i)−Vcmpn(i)). Also, every time an i-th bit is determined to be "0", the CAP drivers 226$p\_j$ and 226$n\_j$ switch the switching elements Sp and Sn to increase the potential difference (Vcmpp(i+1)−Vcmpn(i+1)) by $VREF/2^i$ relative to the potential difference (Vcmpp(i)−Vcmpn(i)). Thereby, the potential difference (Vcmpp-Vcmpn) becomes close to 0 from (Vinp-Vinn), as shown in FIG. 12. If the potential difference (Vcmpp-Vcmpn) becomes small enough to be regarded as 0, the determination process comes to an end.

2.4 Reference Voltage Supplying Process

Figure 14:
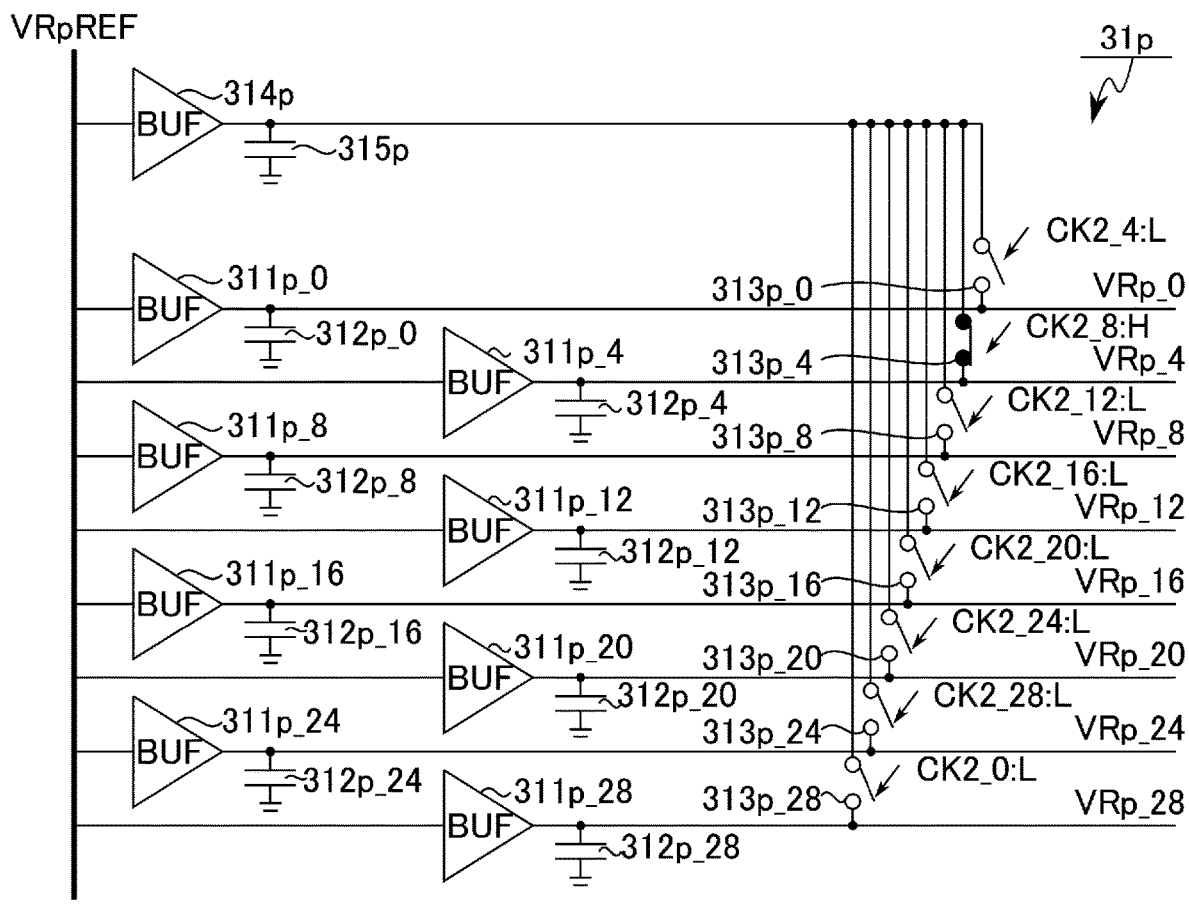
FIG. 14 is a diagram showing another example of the reference voltage supplying process in the receiver device according to the embodiment.

Next, a reference voltage supplying process in the receiver device according to the embodiment will be described. FIGS. 13 and 14 are diagrams each showing an example of a reference voltage supplying process in the receiver device according to the embodiment. In the example of FIG. 13, the VREF driver set 31$p$ in the period $D_{MSB}$ of the signal CK2_0 is shown. In the example of FIG. 14, the VREF driver set 31$p$ in the period $D_{MSB}$ of the signal CK2_4 (i.e., the period $D_{2ND}$ of the signal CK2_0) is shown.

As shown in FIG. 13, the signal CK2_4 is brought to the "H" level during the period $D_{MSB}$ of the signal CK2_0. Thereby, the switching element 313$p\_0$ is brought to an on state. Accordingly, at the time of a determination process of a most significant bit, the SAR-ADC 22_0 is driven with a reference voltage VRp_0 supplied from a synthesis buffer of the buffers 311$p\_0$ and 314$p$ and a synthesis capacitor of the capacitors 312$p\_0$ and 315$p$.

On the other hand, in the period $D_{MSB}$ of the signal CK2_0, the signals CK2_8, CK2_12, CK2_16, CK2_20, CK2_24, CK2_28, and CK2_0 are brought to the "L" level. Thereby, the switching elements 313$p\_8$, 313$p\_12$, 313$p\_16$, 313$p\_20$, 313$p\_24$, 313$p\_28$, and 313$p\_0$ are brought to an off state. Accordingly, at the time of a determination process of a bit other than the most significant bit, the SAR-ADCs 22_4, 22_8, 22_12, 22_16, 22_20, 22_24, and 22_28 are respectively driven with reference voltages VRp_4, VRp_8, VRp_12, VRp_16, VRp_20, VRp_24, and VRp_28 supplied without going through the buffer 314$p$ and the capacitor 315$p$.

As shown in FIG. 14, the signal CK2_8 is brought to the "H" level during the period $D_{MSB}$ of the signal CK2_4. Thereby, the switching element 313$p\_4$ is brought to an on state. Accordingly, at the time of a determination process of a most significant bit, the SAR-ADC 22_4 is driven with a reference voltage VRp_4 supplied from a synthesis buffer of the buffers 311$p\_4$ and 314$p$ and a synthesis capacitor of the capacitors 312$p\_4$ and 315$p$.

On the other hand, in the period $D_{MSB}$ of the signal CK2_4, the signals CK2_12, CK2_16, CK2_20, CK2_24, CK2_28, CK2_0, and CK2_4 are brought to the "L" level. Thereby, the switching elements 313$p\_12$, 313$p\_16$, 313$p\_20$, 313$p\_24$, 313$p\_28$, 313$p\_0$, and 313$p\_4$ are brought to an off state. Accordingly, at the time of a determination process of a bit other than the most significant bit, the SAR-ADCs 22_8, 22_12, 22_16, 22_20, 22_24, 22_28, and 22_0 are respectively driven with the reference voltages VRp_8, VRp_12, VRp_16, VRp_20, VRp_24, VRp_28, and VRp_0 supplied without going through the buffer 314p and the capacitor 315p.

3. Advantageous Effects of Embodiment

In a case of using a time-interleaved successive-approximation register AD converter in high-speed communications, a period during which each bit of the bit string X0<0:7> is determined becomes very short. Accordingly, it is required to quickly converge the potential difference (Vcmpp−Vcmpn) to a desired value for the duration from a potential difference changing process to a subsequent determination process. However, in a potential difference changing process after a most-significant-bit determination process, in particular, the amount of change from the potential difference (Vcmpp0−Vcmpn0) to the potential difference (Vcmpp1−Vcmpn1) is large (VREF/2). Accordingly, an unintended ripple may occur after the potential difference changing process, making it difficult to quickly converge the potential difference (Vcmpp1−Vcmpn1) within a limited period. If the potential difference (Vcmpp−Vcmpn) does not converge to a desired value at the time of the determination process, the possibility of erroneous determination increases, which is unfavorable. To suppress ripples, it is effective to decrease resistance values of the buffers used for supplying the reference voltages VRp and VRn, and increase capacitances of the capacitors. However, if such measures were taken for all the buffers and capacitors in the VREF-GEN 30, the area of the circuitry would be increased, which is unfavorable.

According to the embodiment, a reference voltage VRp is supplied to each of the SAR-ADCs 22_0, 22_4, 22_8, 22_12, 22_16, 22_20, 22_24, and 22_28 by a corresponding buffer and capacitor separated from the buffer 314p and the capacitor 315p, in a period other than the period $D_{MSB}$ of each of the signals CK2_0, CK2_4, CK2_8, CK2_12, CK2_16, CK2_20, CK2_24, and CK2_28. Also, a reference voltage VRp is supplied to each of the SAR-ADCs 22_0, 22_4, 22_8, 22_12, 22_16, 22_20, 22_24, and 22_28 in the period $D_{MSB}$ of each of the signals CK2_0, CK2_4, CK2_8, CK2_12, CK2_16, CK2_20, CK2_24, and CK2_28 while the SAR-ADCs 22_0, 22_4, 22_8, 22_12, 22_16, 22_20, 22_24, and 22_28 are coupled to the buffer 314p and the capacitor 315p. The above-described configuration of the reference voltage VRp similarly applies to the reference voltage VRn. With the above-described configuration, in the case of execution of a potential difference changing process after a determination process of a most significant bit, it is possible to increase the driving capabilities of the buffers and the capacitances of the capacitors, compared to the case of execution of a potential difference changing process after a determination process of a bit other than the most significant bit. Accordingly, it is possible to improve the effect of suppressing ripples caused in the potential difference changing process after the determination process of the most significant bit. It is thereby possible to decrease the possibility of erroneous determination. Also, by allowing the buffer 314p and the capacitor 315p to use eight SAR-ADCs in common, it is possible to suppress an increase in the circuit area of the VREFGEN 30.

4. Modifications, Etc.

The embodiment is not limited to the above-described examples, and various modifications are applicable.

In the above-described embodiment, a case has been described where the SAR-ADC is driven using an additional buffer and capacitor at the time of a determination process of a most significant bit, however, the configuration is not limited thereto. For example, the SAR-ADC may be driven using an additional buffer and capacitor at the time of a determination process of a bit other than the most significant bit.

FIG. 15 is a block diagram showing an example of a configuration of a reference voltage generator of receiver circuitry according to a modification. FIG. 15 corresponds to FIG. 5 according to the embodiment.

The VREFGEN 30' includes a P-side 30p' and an N-side 30n'. The P-side 30p' and the N-side 30n' correspond to circuit portions that generate reference voltages VRp and VRn, respectively.

The P-side 30p' includes VREF driver sets 31p', 32p', 33p', 34p', 35p', 36p', 37p', and 38p'. The VREF driver set 31p' is configured to supply reference voltages VRp_0, VRp_8, VRp_16, and VRp_24 to the SAR-ADCs 22_0, 22_8, 22_16, and 22_24, respectively. The VREF driver set 32p' is configured to supply reference voltages VRp_1, VRp_9, VRp_17, and VRp_25 to the SAR-ADCs 22_1, 22_9, 22_17, and 22_25, respectively. The VREF driver set 33p' is configured to supply reference voltages VRp_2, VRp_10, VRp_18, and VRp_26 to the SAR-ADCs 22_2, 22_10, 22_18, and 22_26, respectively. The VREF driver set 34p' is configured to supply reference voltages VRp_3, VRp_11, VRp_19, and VRp_27 to the SAR-ADCs 22_3, 22_11, 22_19, and 22_27, respectively. The VREF driver set 35p' is configured to supply reference voltages VRp_4, VRp_12, VRp_20, and VRp_28 to the SAR-ADCs 22_4, 22_12, 22_20, and 22_28, respectively. The VREF driver set 36p' is configured to supply reference voltages VRp_5, VRp_13, VRp_21, and VRp_29 to the SAR-ADCs 22_5, 22_13, 22_21, and 22_29, respectively. The VREF driver set 37p' is configured to supply reference voltages VRp_6, VRp_14, VRp_22, and VRp_30 to the SAR-ADCs 22_6, 22_14, 22_22, and 22_30, respectively. The VREF driver set 38p' is configured to supply reference voltages VRp_7, VRp_15, VRp_23, and VRp_31 to the SAR-ADCs 22_7, 22_15, 22_23, and 22_31, respectively.

The N-side 30n' includes VREF driver sets 31n', 32n', 33n', 34n', 35n', 36n', 37n', and 38n'. The VREF driver set 31n' is configured to supply reference voltages VRn_0, VRn_8, VRn_16, and VRn_24 to the SAR-ADCs 22_0, 22_8, 22_16, and 22_24, respectively. The VREF driver set 32n' is configured to supply reference voltages VRn_1, VRn_9, VRn_17, and VRn_25 to the SAR-ADCs 22_1, 22_9, 22_17, and 22_25, respectively. The VREF driver set 33n' is configured to supply reference voltages VRn_2, VRn_10, VRn_18, and VRn_26 to the SAR-ADCs 22_2, 22_10, 22_18, and 22_26, respectively. The VREF driver set 34n' is configured to supply reference voltages VRn_3, VRn_11, VRn_19, and VRn_27 to the SAR-ADCs 22_3, 22_11, 22_19, and 22_27, respectively. The VREF driver set 35n' is configured to supply reference voltages VRn_4, VRn_12, VRn_20, and VRn_28 to the SAR-ADCs 22_4, 22_12, 22_20, and 22_28, respectively. The VREF driver set 36n' is configured to supply reference voltages VRn_5, VRn_13, VRn_21, and VRn_29 to the SAR-ADCs 22_5, 22_13, 22_21, and 22_29, respectively. The VREF driver set 37n' is configured to supply reference voltages VRn_6, VRn_14, VRn_22, and VRn_30 to the SAR-ADCs 22_6, 22_14, 22_22, and 22_30, respectively. The VREF driver set 38n' is configured to supply reference voltages VRn_7, VRn_15, VRn_23, and VRn_31 to the SAR-ADCs 22_7, 22_15, 22_23, and 22_31, respectively.

The VREF driver sets 31p', 32p', 33p', 34p', 35p', 36p', 37p', and 38p' have configurations equivalent to one another, except for difference in a destination to which the reference voltage VRp is output. The VREF driver sets 31n', 32n', 33n', 34n', 35n', 36n', 37n', and 38n' respectively have a configuration equivalent to that of the VREF driver sets 31p', 32p', 33p', 34p', 35p', 36p', 37p', and 38p', except that a reference voltage VRn is output in place of the reference voltage VRp. Hereinafter, a configuration of the VREF driver set 31p' will be described as an example.

FIG. 16 is a block diagram showing an example of a configuration of a VREF driver set of the reference voltage generator according to the modification. FIG. 16 corresponds to FIG. 6 according to the embodiment.

The VREF driver set 31p' includes a plurality of buffers 311p', a plurality of capacitors 312p', a plurality of switching elements 313p' and 314p', a buffer 315p', and a capacitor 316p'. The plurality of buffers 311p' include four buffers 311p'_0, 311p'_8, 311p'_16, and 311p'_24. The plurality of capacitors 312p' include four capacitors 312p'_0, 312p'_8, 312p'_16, and 312p'_24. The plurality of switching elements 313p' include four switching elements 313p'_0, 313p'_8, 313p'_16, and 313p'_24. The plurality of switching elements 314p' include four switching elements 314p'_0, 314p'_8, 314p'_16, and 314p'_24.

A reference voltage VRpREF is supplied to an input end of each of the buffers 311p' and an input end of the buffer 315p'.

An output end of the buffer 311p'_0 is coupled to a first end of the capacitor 312p'_0, a first end of the switching element 313p'_0, a first end of the switching element 314p'_0, and the SAR-ADC 22_0. An output end of the buffer 311p'_8 is coupled to a first end of the capacitor 312p'_8, a first end of the switching element 313p'_8, a first end of the switching element 314p'_8, and the SAR-ADC 22_8. An output end of the buffer 311p'_16 is coupled to a first end of the capacitor 312p'_16, a first end of the switching element 313p'_16, a first end of the switching element 314p'_16, and the SAR-ADC 22_16. An output end of the buffer 311p'_24 is coupled to a first end of the capacitor 312p'_24, a first end of the switching element 313p'_24, a first end of the switching element 314p'_24, and the SAR-ADC 22_24. A second end of each of the capacitors 312p'_0, 312p'_8, 312p'_16, and 312p'_24 is grounded.

An output end of the buffer 315p' is coupled to a first end of the capacitor 316p', and to a second end of each of the switching elements 313p'_0, 313p'_8, 313p'_16, 313p'_24, 314p'_0, 314p'_8, 314p'_16, and 314p'_24. A second end of the capacitor 316p' is grounded.

The switching elements 313p'_0, 313p'_8, 313p'_16, and 313p'_24 are brought to an on state if the corresponding signals CK2_4, CK2_12, CK2_20, and CK2_28 are at the "H" level, and are brought to an off state if the corresponding signals are at the "L" level.

The switching elements 314p'_0, 314p'_8, 314p'_16, and 314p'_24 are brought to an on state if the corresponding signals CK2_8, CK2_16, CK2_24, and CK2_0 are at the "H" level, and are brought to an off state if the corresponding signals are at the "L" level.

With the above-described configuration, the switching element 313p'_0 is brought to an on state in the period $D_{MSB}$ of the signal CK2_0. Also, the switching element 314p'_0 is brought to an on state in the period $D_{2ND}$ of the signal CK2_0. Accordingly, at the time of a determination process of a most significant bit and a second most significant bit, the SAR-ADC 22_0 is driven with a reference voltage VRp_0 supplied from a synthesis buffer of the buffers 311p'_0 and 315p' and a synthesis capacitor of the capacitors 312p'_0 and 316p'.

On the other hand, in the periods $D_{MSB}$ and $D_{2ND}$ of the signal CK2_0, all the switching elements 313p'_8, 313p'_16, and 313p'_24, 314p'_8, 314p'_16, and 314p'_24 are brought to an off state. Accordingly, at the time of a determination process of a bit other than the most significant bit and the second most significant bit, the SAR-ADCs 22_8, 22_16, and 22_24 are respectively driven with reference voltages VRp_8, VRp_16, and VRp_24 supplied without going through the buffer 315p' and the capacitor 316p'.

With the above-described configuration, it is possible to expand the period during which ripples are suppressed to the period of determination processes of a plurality of bits, while allowing a plurality of SAR-ADCs to use the buffer 315p' and the capacitor 316p' in common.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The embodiments and their modifications are covered by the accompanying claims and their equivalents, as would fall within the scope and gist of the inventions.

What is claimed is:

1. A semiconductor integrated circuit comprising:
a first converter configured to determine a first bit string from an analog signal based on a first clock signal;
a second converter configured to determine a second bit string from the analog signal based on a second clock signal shifted from the first clock signal by a first phase; and
a circuit configured to supply a reference voltage to the first converter and the second converter, wherein
the circuit includes:
a first capacitor;
a second capacitor;
a third capacitor;
a first switching element;
a second switching element;
a first buffer including: an input end to which a voltage corresponding to the reference voltage is supplied; and an output end coupled to the first capacitor, a first end of the first switching element, and a first end of the second switching element;
a second buffer including: an input end to which the voltage corresponding to the reference voltage is supplied; and an output end coupled to the second capacitor, a second end of the first switching element, and the first converter; and
a third buffer including: an input end to which the voltage corresponding to the reference voltage is supplied; and an output end coupled to the third capacitor, a second end of the second switching element, and the second converter.

2. The semiconductor integrated circuit according to claim 1, wherein
both of the first converter and the second converter includes successive-approximation register analog-to-digital converters (SAR ADC).

3. The semiconductor integrated circuit according to claim 2, wherein
the first switching element is configured to be brought to an on state in a first period in which the first converter determines a first bit of the first bit string, and
the second switching element is configured to be brought to an on state in a second period in which the second converter determines a second bit of the second bit string, the second period not overlapping the first period.

4. The semiconductor integrated circuit according to claim 3, wherein
the first switching element is configured to switch between the on state and an off state based on the second clock signal.

5. The semiconductor integrated circuit according to claim 3, wherein
the first bit is a most significant bit of the first bit string, and
the second bit is a most significant bit of the second bit string.

6. The semiconductor integrated circuit according to claim 1, wherein
the circuit further includes:
a third switching element coupled in parallel with the first switching element between the output end of the first buffer and the output end of the second buffer;
a fourth switching element coupled in parallel with the second switching element between the output end of the first buffer and the output end of the third buffer.

7. The semiconductor integrated circuit according to claim 6, wherein
the first switching element is configured to be brought to an on state in a first period in which the first converter determines a first bit of the first bit string,
the second switching element is configured to be brought to an on state in a second period in which the second converter determines a second bit of the second bit string, the second period not overlapping the first period,
the third switching element is configured to be brought to an on state in a third period in which the first converter determines a third bit of the first bit string, the third period not overlapping the first period and the second period, and
the fourth switching element is configured to be brought to an on state in a fourth period in which the second converter determines a fourth bit of the second bit string, the fourth period not overlapping the first period, the second period, and the third period.

8. The semiconductor integrated circuit according to claim 7, further comprising:
a third converter configured to determine a third bit string from the analog signal based on a third clock signal shifted from the first clock signal by a second phase, the second phase differing from the first phase, wherein
the first switching element is configured to switch between the on state and an off state based on the second clock signal, and
the third switching element is configured to switch between the on state and an off state based on the third clock signal.

9. The semiconductor integrated circuit according to claim 7, wherein
the first bit is a most significant bit of the first bit string,
the second bit is a most significant bit of the second bit string,
the third bit is a second most significant bit of the first bit string, and
the fourth bit is a second most significant bit of the second bit string.

10. A receiver device, comprising:
a semiconductor integrated circuit; and
a processing circuit configured to process a signal output from the semiconductor integrated circuit, wherein
the semiconductor integrated circuit includes:
a first converter configured to determine a first bit string from an analog signal based on a first clock signal;
a second converter configured to determine a second bit string from the analog signal based on a second clock signal shifted from the first clock signal by a first phase; and
a circuit configured to supply a reference voltage to the first converter and the second converter, wherein
the circuit includes:
a first capacitor;
a second capacitor;
a third capacitor;
a first switching element;
a second switching element;
a first buffer including: an input end to which a voltage corresponding to the reference voltage is supplied; and an output end coupled to the first capacitor, a first end of the first switching element, and a first end of the second switching element;
a second buffer including: an input end to which the voltage corresponding to the reference voltage is supplied; and an output end coupled to the second capacitor, a second end of the first switching element, and the first converter; and
a third buffer including: an input end to which the voltage corresponding to the reference voltage is supplied; and an output end coupled to the third capacitor, a second end of the second switching element, and the second converter.

11. The receiver device according to claim 10, wherein
both of the first converter and the second converter includes successive-approximation register AD converters.

12. The receiver device according to claim 11, wherein
the first switching element is configured to be brought to an on state in a first period in which the first converter determines a first bit of the first bit string, and
the second switching element is configured to be brought to an on state in a second period in which the second converter determines a second bit of the second bit string, the second period not overlapping the first period.

13. The receiver device according to claim 12, wherein
the first switching element is configured to switch between the on state and an off state based on the second clock signal.

14. The receiver device according to claim 12, wherein
the first bit is a most significant bit of the first bit string, and
the second bit is a most significant bit of the second bit string.

15. The receiver device according to claim 10, wherein the circuit further includes:
- a third switching element coupled in parallel with the first switching element between the output end of the first buffer and the output end of the second buffer; and
- a fourth switching element coupled in parallel with the second switching element between the output end of the first buffer and the output end of the third buffer.

16. The receiver device according to claim 15, wherein the first switching element is configured to be brought to an on state in a first period in which the first converter determines a first bit of the first bit string,
the second switching element is configured to be brought to an on state in a second period in which the second converter determines a second bit of the second bit string, the second period not overlapping the first period,
the third switching element is configured to be brought to an on state in a third period in which the first converter determines a third bit of the first bit string, the third period not overlapping the first period and the second period, and
the fourth switching element is configured to be brought to an on state in a fourth period in which the second converter determines a fourth bit of the second bit string, the fourth period not overlapping the first period, the second period, and the third period.

17. The receiver device according to claim 16, further comprising:
- a third converter configured to determine a third bit string from the analog signal based on a third clock signal shifted from the first clock signal by a second phase, the second phase differing from the first phase, wherein
the first switching element is configured to switch between the on state and an off state based on the second clock signal, and
the third switching element is configured to switch between the on state and an off state based on the third clock signal.

18. The receiver device according to claim 16, wherein the first bit is a most significant bit of the first bit string,
the second bit is a most significant bit of the second bit string,
the third bit is a second most significant bit of the first bit string, and
the fourth bit is a second most significant bit of the second bit string.

* * * * *